(12) United States Patent
Carr

(10) Patent No.: US 7,510,664 B2
(45) Date of Patent: *Mar. 31, 2009

(54) APPARATUS AND METHOD FOR ATMOSPHERIC PRESSURE REACTIVE ATOM PLASMA PROCESSING FOR SHAPING OF DAMAGE FREE SURFACES

(75) Inventor: Jeffrey W. Carr, Livermore, CA (US)

(73) Assignee: RAPT Industries, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/002,035

(22) Filed: Nov. 1, 2001

(65) Prior Publication Data

US 2002/0148560 A1   Oct. 17, 2002

Related U.S. Application Data

(60) Provisional application No. 60/265,332, filed on Jan. 30, 2001.

(51) Int. Cl.
*B29D 11/00* (2006.01)
*C23F 1/00* (2006.01)

(52) U.S. Cl. ............................. 216/24; 216/38; 216/68; 216/80

(58) Field of Classification Search ................... 216/24, 216/67; 264/1.36; 219/121.51
See application file for complete search history.

(56) References Cited

U.S. PATENT DOCUMENTS 3,264,508 A   8/1966   Lai et al. ............... 313/231.01
3,830,428 A   8/1974   Dyos
3,937,866 A   2/1976   Sunnen et al. ............... 373/20

(Continued)

FOREIGN PATENT DOCUMENTS

DE   199 25 790 A1   12/2000

(Continued)

OTHER PUBLICATIONS

Zarowin et al. Rapid Non-contact, damage free shaping of Optical & Other Surfaces with Plasma Assisted Chemical Etching, 43rd Anuual Symposium on Frequency Control 1989, 623-626.*

(Continued)

*Primary Examiner*—Allan Olsen
(74) *Attorney, Agent, or Firm*—Fliesler Meyer LLP

(57) ABSTRACT

Fabrication apparatus and methods are disclosed for shaping and finishing difficult materials with no subsurface damage. The apparatus and methods use an atmospheric pressure mixed gas plasma discharge as a sub-aperture polisher of, for example, fused silica and single crystal silicon, silicon carbide and other materials. In one example, workpiece material is removed at the atomic level through reaction with fluorine atoms. In this example, these reactive species are produced by a noble gas plasma from trace constituent fluorocarbons or other fluorine containing gases added to the host argon matrix. The products of the reaction are gas phase compounds that flow from the surface of the workpiece, exposing fresh material to the etchant without condensation and redeposition on the newly created surface. The discharge provides a stable and predictable distribution of reactive species permitting the generation of a predetermined surface by translating the plasma across the workpiece along a calculated path.

36 Claims, 10 Drawing Sheets

U.S. PATENT DOCUMENTS

| | | | |
|---|---|---|---|
| 3,953,704 A | 4/1976 | Bejat et al. | 219/76.16 |
| 4,035,604 A | 7/1977 | Meleka et al. | 219/121.44 |
| 4,050,408 A | 9/1977 | Beucherie | 118/49.1 |
| 4,306,175 A | 12/1981 | Schleicher | 315/111.21 |
| 4,339,326 A | 7/1982 | Hirose et al. | 204/298.39 |
| 4,431,898 A | 2/1984 | Reinberg | 219/121 PG |
| 4,431,901 A | 2/1984 | Hull | 219/121 PR |
| 4,439,463 A | 3/1984 | Miller | 427/563 |
| 4,440,556 A * | 4/1984 | Oh et al. | 65/391 |
| 4,440,558 A * | 4/1984 | Nath et al. | 65/391 |
| 4,532,199 A | 7/1985 | Ueno | 430/128 |
| 4,668,366 A | 5/1987 | Zarowin | 204/192.1 |
| 4,674,683 A | 6/1987 | Fabel | |
| 4,689,467 A | 8/1987 | Inoue | 219/121.6 |
| 4,739,147 A | 4/1988 | Meyer et al. | 219/121.48 |
| 4,771,015 A | 9/1988 | Kanai et al. | 427/574 |
| 4,863,501 A * | 9/1989 | Mansfield | 65/391 |
| 4,897,282 A | 1/1990 | Kniseley et al. | 427/446 |
| 4,908,492 A | 3/1990 | Okamoto et al. | 219/121.52 |
| 4,924,061 A | 5/1990 | Labat et al. | 219/121.52 |
| 4,958,767 A * | 9/1990 | Labrot et al. | 219/121.48 |
| 5,000,771 A | 3/1991 | Fleming et al. | 65/391 |
| 5,007,771 A | 4/1991 | Fu et al. | 405/128.75 |
| 5,095,189 A * | 3/1992 | Frind et al. | 219/121.47 |
| 5,106,827 A | 4/1992 | Borden | 505/1 |
| 5,144,151 A | 9/1992 | Thorne et al. | 250/559.42 |
| 5,200,595 A | 4/1993 | Boulos | 219/121.52 |
| 5,206,471 A * | 4/1993 | Smith | 219/687 |
| 5,238,532 A | 8/1993 | Zarowin | 156/643 |
| 5,254,830 A | 10/1993 | Zarowin | 219/121.43 |
| 5,256,205 A | 10/1993 | Schmitt, III | |
| 5,280,154 A | 1/1994 | Cuomo | 219/121.52 |
| 5,290,382 A | 3/1994 | Zarowin | 156/345 |
| 5,291,415 A | 3/1994 | Zarowin | 364/474.3 |
| 5,292,400 A | 3/1994 | Mumola | 156/643 |
| 5,298,103 A | 3/1994 | Steinberg | 156/345 |
| 5,298,714 A * | 3/1994 | Szente et al. | 219/121.48 |
| 5,302,237 A | 4/1994 | Larson et al. | 156/643 |
| 5,321,224 A | 6/1994 | Kamimura et al. | 219/76.15 |
| 5,336,355 A | 8/1994 | Zarowin | 156/345 |
| 5,344,524 A | 9/1994 | Sharma | 156/630 |
| 5,346,578 A | 9/1994 | Benzing | 156/345 |
| 5,349,154 A | 9/1994 | Harker et al. | 117/102 |
| 5,356,674 A * | 10/1994 | Henne et al. | 427/449 |
| 5,364,434 A | 11/1994 | Saghera et al. | 65/30.1 |
| 5,364,496 A | 11/1994 | Bollinger | 156/643 |
| 5,372,674 A | 12/1994 | Steinberg | 156/643 |
| 5,375,064 A | 12/1994 | Bollinger | 364/474.3 |
| 5,376,224 A | 12/1994 | Zarowin | 156/643 |
| 5,386,119 A | 1/1995 | Ledger | 250/341.1 |
| 5,405,480 A | 4/1995 | Benzing | 156/345 |
| 5,419,803 A | 5/1995 | Mumola | 216/38 |
| 5,429,730 A | 7/1995 | Nakamura et al. | 204/192.34 |
| 5,430,355 A | 7/1995 | Paranjpe | 315/111.21 |
| 5,468,955 A | 11/1995 | Chen et al. | 250/251 |
| 5,474,642 A | 12/1995 | Zorina et al. | 156/345.24 |
| 5,503,677 A | 4/1996 | Morsen et al. | 118/723 R |
| 5,563,709 A | 10/1996 | Poultney | 356/371 |
| 5,591,068 A | 1/1997 | Taylor | 451/104 |
| 5,629,054 A | 5/1997 | Kanai | 427/575 |
| 5,639,699 A | 6/1997 | Nakamura et al. | 427/527 |
| 5,650,032 A | 7/1997 | Keller | 156/345 |
| 5,676,863 A | 10/1997 | Jouvenel | 219/121.52 |
| 5,680,382 A | 10/1997 | Inoue | 369/53.2 |
| 5,683,548 A | 11/1997 | Hartig | |
| 5,688,415 A | 11/1997 | Bollinger | 219/121.41 |
| 5,767,627 A | 6/1998 | Siniaguine | 315/111.41 |
| 5,795,493 A | 8/1998 | Bukhman | 216/59 |
| 5,811,021 A | 9/1998 | Zarowin | 216/67 |
| 5,811,022 A | 9/1998 | Savas | 216/68 |
| 5,820,940 A | 10/1998 | Gorynin et al. | 427/455 |
| 5,863,829 A | 1/1999 | Nakayoshi | 438/459 |
| 5,877,471 A | 3/1999 | Huhn | 219/121.49 |
| 5,897,712 A | 4/1999 | Hanawa | 216/68 |
| 5,916,455 A | 6/1999 | Kumagai | 216/68 |
| 5,925,266 A * | 7/1999 | Gagne | 219/121.48 |
| 5,932,293 A | 8/1999 | Belashchenko et al. | |
| 5,942,445 A | 8/1999 | Kato | 438/691 |
| 5,944,902 A | 8/1999 | Redeker | 118/723 AN |
| 5,955,383 A | 9/1999 | Hwang | 438/729 |
| 5,961,772 A | 10/1999 | Selwyn | 156/345 |
| 5,965,034 A | 10/1999 | Vinogradov | 216/68 |
| 5,981,392 A | 11/1999 | Oishi | 438/691 |
| 5,998,757 A | 12/1999 | Schneider | 219/121.54 |
| 6,004,866 A | 12/1999 | Nakano | 438/459 |
| 6,017,221 A | 1/2000 | Flamm | 437/225 |
| 6,028,286 A | 2/2000 | Wicker | 219/121.53 |
| 6,030,489 A | 2/2000 | Hwang | 156/345 |
| 6,040,548 A | 3/2000 | Siniaguine | 219/121.48 |
| 6,041,623 A | 3/2000 | Fleming | 65/391 |
| 6,056,848 A | 5/2000 | Daviet | 156/345 |
| 6,068,784 A | 5/2000 | Collins | 216/68 |
| 6,073,578 A | 6/2000 | Shim | 118/723 I |
| 6,074,947 A | 6/2000 | Mumola | 438/689 |
| 6,085,688 A | 7/2000 | Lymberopoulos | 118/723 I |
| 6,093,655 A | 7/2000 | Donohoe | 438/717 |
| 6,105,534 A | 8/2000 | Siniaguine | 118/723 EB |
| 6,139,678 A | 10/2000 | Siniaguine | 156/345 |
| 6,143,129 A | 11/2000 | Savas | 156/345 |
| 6,148,764 A | 11/2000 | Cui et al. | 118/715 |
| 6,153,852 A | 11/2000 | Blutke | 219/121.59 |
| 6,159,388 A * | 12/2000 | Yanagisawa et al. | 216/60 |
| 6,170,428 B1 | 1/2001 | Redeker | 118/723 I |
| 6,194,036 B1 | 2/2001 | Babayan | 427/563 |
| 6,200,908 B1 | 3/2001 | Vandamme | 438/719 |
| 6,203,661 B1 | 3/2001 | Siniaguine | 156/345 |
| 6,207,924 B1 * | 3/2001 | Trassy | 219/121.52 |
| 6,209,480 B1 | 4/2001 | Moslehi | 118/723 I |
| 6,214,161 B1 | 4/2001 | Becker | 156/345 |
| 6,218,640 B1 | 4/2001 | Selitser | 219/121.52 |
| 6,221,268 B1 | 4/2001 | Li et al. | 216/67 |
| 6,228,330 B1 | 5/2001 | Herrmann | 422/186.05 |
| 6,229,111 B1 | 5/2001 | McCay et al. | 219/121.59 |
| 6,238,587 B1 | 5/2001 | Siniaguine | 216/59 |
| 6,239,004 B1 | 5/2001 | Aga | 438/455 |
| 6,239,553 B1 | 5/2001 | Barnes | 315/111.51 |
| 6,245,202 B1 | 6/2001 | Edamura | 204/298.06 |
| 6,262,523 B1 | 7/2001 | Selwyn et al. | 313/231.31 |
| 6,284,668 B1 | 9/2001 | Imahashi | 438/716 |
| 6,312,554 B1 * | 11/2001 | Ye | 156/345.38 |
| 6,388,225 B1 | 5/2002 | Blum et al. | 219/121.48 |
| 6,406,590 B1 | 6/2002 | Ebata et al. | 156/345.43 |
| 6,417,028 B2 | 7/2002 | Wensel | 438/112 |
| 6,424,091 B1 | 7/2002 | Sawada et al. | 315/111.81 |
| 6,482,476 B1 | 11/2002 | Liu | 427/535 |
| 6,491,978 B1 | 12/2002 | Kalyanam | 427/255.394 |
| 6,534,921 B1 | 3/2003 | Seo et al. | 315/111.51 |
| 6,551,860 B2 | 4/2003 | Uner et al. | 438/115 |
| 6,660,177 B2 | 12/2003 | Carr | 216/63 |
| 6,663,231 B2 | 12/2003 | Lee et al. | 347/68 |
| 6,683,272 B2 | 1/2004 | Hammer | 219/121.48 |
| 6,821,500 B2 | 11/2004 | Fincke et al. | 423/650 |
| 6,929,865 B2 | 8/2005 | Myrick | 428/469 |
| 7,297,892 B2 | 11/2007 | Kelley et al. | 219/121.42 |
| 7,304,263 B2 | 12/2007 | Chang et al. | 219/121.41 |
| 7,311,851 B2 | 12/2007 | Carr | 216/63 |
| 2001/0052257 A1 | 12/2001 | Margerle | |
| 2002/0037374 A1 | 3/2002 | Gherardi et al. | |
| 2002/0038689 A1 | 4/2002 | Bayer et al. | |
| 2002/0058143 A1 | 5/2002 | Hunt et al. | |
| 2002/0100751 A1 | 8/2002 | Carr | |
| 2002/0148560 A1 | 10/2002 | Carr | |
| 2003/0021746 A1 | 1/2003 | Fincke et al. | |
| 2003/0113479 A1 | 6/2003 | Fukuda et al. | |

| | | | |
|---|---|---|---|
| 2003/0230112 A1 | 12/2003 | Ikeda et al. | |
| 2004/0115936 A1 | 6/2004 | DePetrillo et al. | |
| 2004/0118348 A1 | 6/2004 | Mills | |
| 2004/0173316 A1 | 9/2004 | Carr | |
| 2004/0173579 A1 | 9/2004 | Carr | |
| 2004/0173580 A1 | 9/2004 | Carr | |
| 2005/0000656 A1 | 1/2005 | Carr | |
| 2005/0018199 A1 | 1/2005 | LeBlanc | |
| 2005/0061774 A1 | 3/2005 | Kelley et al. | |
| 2005/0118348 A1 | 6/2005 | Kasma | |
| 2005/0184034 A1 | 8/2005 | Carr | |
| 2008/0029485 A1 | 2/2008 | Kelley et al. | |
| 2008/0035612 A1 | 2/2008 | Chang et al. | |

FOREIGN PATENT DOCUMENTS

| | | | |
|---|---|---|---|
| EP | 0 284 436 A2 | | 9/1988 |
| EP | 0 546 842 A1 | | 6/1993 |
| JP | 50-153024 | | 12/1975 |
| JP | 63-289798 | | 11/1988 |
| JP | 01 96040 A | | 4/1989 |
| JP | 05135896 A | * | 6/1993 |
| JP | 9-69397 | | 3/1997 |
| JP | 9-115865 | | 5/1997 |
| JP | 10 298318 A | | 11/1998 |
| JP | 2000/173994 A | | 6/2000 |
| JP | 2000/174004 | | 6/2000 |
| JP | 2000-183044 | | 6/2000 |
| JP | 2002-170815 | | 6/2002 |
| WO | WO/9745856 | | 12/1997 |
| WO | WO 02/061171 A1 | | 8/2002 |
| WO | WO 02/062111 A2 | | 8/2002 |

OTHER PUBLICATIONS

Kulikovsky, Andrei A., Production of Chemically Active Species in the Air by a Single Positive Streamer in a Nonuniform Field, IEEE Transactions on Plasma Science vol. 25, No. 3, pp. 439-446, Jun. 1997.*

Bollinger et al., Rapid, Non-Contact Optical Figuring of Aspheric Surfaces with Plasma Assisted Chemical Etching (PACE), 1990, SPIE vol. 1333, Advanced Optical Manufacturing and Testing, pp. 44-57.*

International Search Report Mailed Oct. 31, 2005, PCT.

Supplementary European Search Report, EPO, mailed Dec. 21, 2006, 4 pages.

Takino, et al., "Computer Numerically Controlled Plasma Chemical Vaporization Machining with a Pipe Electrode for Optical Fabrication," Applied Optics, vol. 37, No. 22, pp. 5198-5210, Aug. 1, 1998.

Supplementary European Search Report, EP Application No. 02706029.2 mailed Mar. 5, 2008, 4 pages.

Supplementary European Search Report, EP Application No. 02706044.1 mailed Mar. 7, 2008, 4 pages.

* cited by examiner (all measurements are in millimeters)

APPARATUS AND METHOD FOR ATMOSPHERIC PRESSURE REACTIVE ATOM PLASMA PROCESSING FOR SHAPING OF DAMAGE FREE SURFACES

CLAIM OF PRIORITY

This application claims priority to U.S. Provisional patent application No. 60/265,332, filed Jan. 30, 2001, entitled, APPARATUS AND METHOD FOR ATMOSPHERIC PRESSURE REACTIVE ATOM PLASMA PROCESSING FOR SHAPING OF DAMAGE FREE SURFACES incorporated herein by reference.

The United States Government has rights in this invention pursuant to Contract No. W-7405-ENG-48 between the United States Department of Energy and the University of California.

FIELD OF INVENTION

The field of the invention relates to shaping surfaces using a gas plasma.

BACKGROUND OF THE INVENTION

Modern materials present a number of formidable challenges to the fabricators of optics and other precision components. There is a general need to handle high fluences and to produce lenses and mirrors that are highly aspheric. Any form of contact figuring or polishing introduces a degree of distortion into the workpiece. Present finishing technologies involve the creation of significant levels of surface and subsurface damage and are difficult to apply to non-spherical shapes. In spite of 5000 years of development, final figuring and polishing is still largely a black art. The scientific principles controlling current systems are very complicated and involve surface and solution chemistry as well as mechanical abrasion. There are continuing requirements to have cost effective apparatus and methods of super finishing for a number of micro and precision components along with the more traditional laboratory demand for extraordinary one-of-a-kind optics. Many quality optics are currently available only in limited numbers; but, are restricted in their use because of the high cost. In many applications, mechanically inferior or more costly materials are used because the material of first choice (in terms of performance) is too difficult to fabricate.

In demanding applications, the success of any manufactured precision component depends on the surface and near-surface quality. Damage, present in crystalline or amorphous substrates as cracks, voids or plastically deformed material can lower the damage threshold for high fluence use or increase the chemical activity of the surface (corrosion). A shaping and finishing process that involves surface contact will introduce damage to some degree. In addition, for silica glass optics, high quality final finishing is accomplished through complex solution phase chemistry that tends to deposit contaminants in a gel-like layer on the surface of the component. While an extremely smooth part can be produced, the top layer often hides an extensive damage layer below. An optimum approach to final surface generation would involve a non-contact system that removes material chemically without residual contamination. A number of attempts at non-contact material removal have been reported.

Plasma etching at reduced pressure is extensively used in the semiconductor industry for processing of a wide variety of materials including semiconductors, metals and glasses (1). The references cited herein are listed as end notes and are all incorporated by reference. Removal mechanisms and removal rates have been studied extensively and are reasonably well understood. With pressures in the 10 to 20 millitorr range, ion and electron densities are on the order of $10^9$ to $10^{10}$ cm$^{-2}$. These reactive ions are believed responsible for the majority of material removal. Consequently, the technique is known as reactive ion etch (RIE). With electron energies in the 3 to 30 eV range, material removal tends to be largely chemical in nature. Below 50 eV physical sputtering is negligible and subsurface damage is non-existent. In the absence of sputtering, reaction products must be volatile or the process is self terminating after the formation of the first product layer.

Considerable effort has been put into developing plasmas with uniform etch rates over the entire discharge making RIE unsuitable for the production of figured precision components. However, the greatest practical drawback to the technique for cost-effective fabrication and finishing would be the low rate of material removal and the requirement of a vacuum. Translating either the source or workpiece with precision in a complicated pattern inside a vacuum chamber is challenging, especially in the case of large optics. In-situ metrology can also be awkward. Fortunately, the chemistry that occurs in RIE systems is similar to that of higher pressure systems. The main difference is the population shift between atom and ion species in the tail of the high pressure discharge. There, atoms produced by ion-electron recombination reactions predominate. As a result, reactive gas mixtures that are used in RIE will also work for atmospheric systems.

A modified RIE for polishing at reduced pressure has been built using a capacitively coupled discharge (2-5). Named "Plasma Assisted Chemical Machining (PACE), the system has been successful in shaping and polishing fused silica. In the first application of PACE, Bollinger et. al. (2) noted that a 1" discharge controlled material removal to better than 1% with removal rates from 0 to 10 um/min. The footprint and the rates could be varied during the process by changing plasma parameters such as power and reactive gas flow. In subsequent analysis, the parts showed no evidence of subsurface damage, no surface contamination and no distortion at the edge of the optic (roll-off). Material removal could be predicted from a linear superposition of the static footprint. Control algorithms were developed to permit fabrication of an aspherical optic from knowledge of static behavior (3).

An updated low pressure system with a 13 mm capacitively coupled discharge was built to shape and polish single crystal silicon and silicon over silicon carbide (5). While the results for sub-surface damage were similar to previous studies (2-4) the authors also considered the evolution of surface roughness and its relationship to previous process steps. These authors found that greater sub-surface damage results in an increase in roughness.

A major limitation of the capacitively coupled discharge is the requirement that the workpiece be either conductive or less than 10 mm thick. In addition, etch rates were noted to be dependant on part thickness decreasing by a factor of ten when thickness changed from 2 to 10 mm. Above 10 mm the rates were too low to be of much use (20 nm/min) (4). Optics up to 188 mm in diameter with 30° of slope were polished under mild vacuum. With metrology used in an iterative procedure, the chamber is vented and pumped down for the next etch step. The convergence rate for PACE is typically low, resulting in a long and arduous (expensive) process. In-situ real time metrology is difficult and can require a dedicated or custom built system. While extension to larger workpieces is certainly possible, the difficulty in handling large parts is clear.

Ion beam sputtering or neutral ion beam milling removes material from the surface of the workpiece by kinetic interaction of ions with atoms or molecules of the surface. The technique has been around for quite a while (6) and the main application has been optical polishing for fused silica optics (7, 8). Earliest sources used beams with energies that were a large fraction of an MeV, while most recent systems use Kaufman sources with energies of 1500 eV to providing the optimum sputter yield. Researchers claim several advantages for ion milling. Chief among them are: no surface contact, no weight on the optic, no edge effects, high removal rate, and efficient correction of long spatial wavelength errors. The removal rates for a 1 amp beam on fused silica are about 0.35 $cm^3h^{-1}$; however, such high currents are rarely used. A more typical value is 30 mA providing a removal rate nearer to 0.01 $cm^3h^{-1}$. Zerodur was a factor of two slower. Ten hours was required for correcting (not figuring) a 30 cm optic.

As with any sub-aperture tool, the footprint must be stable and predicable. The Kaufman source, which typically produces Gaussian beams 3 to 15 cm in diameter, meets these needs quite well. The size of the beam can usually be reduced with an aperture. Configuring algorithms for the production of aspheric or non-rotationally symmetric workpieces have been extensively developed (11).

Observed disadvantages include high surface temperatures, an increase in surface roughness, and the need for a vacuum (and to do translation in that vacuum). The temperature is dependant on beam current so an increase in etch rate assumes an increase in temperature, often surpassing several hundred ° C. An increase in roughness on undamaged material occurs primarily from redeposition. This problem is largely uncorrectable because the sputtered material does not remain in the vapor phase and will, on cooling, condense on the nearest surface. Although, later efforts suggest that any amount of subsurface damage in the workpiece will degrade surface quality (9). Typically a 50% roughness increase for shallow etched parts can be expected (10). The difficulty in working under vacuum is only a practical consideration, especially for large optics. This was not a concern of the engineers at Kodak who have built an ion beam figuring chamber capable of handling a workpiece that is 2.5×2.5×0.6 m in size (8).

One investigator used a direct current plasma (DCP) at atmospheric pressure to build a device capable of thinning wafers (12). The system, called a "Plasma Jet", uses argon as the plasma gas with a trace amount of fluorine or chlorine for reactive atom production. The main intent of the device is to do backside thinning of processed silicon wafers for smart card and other consumer applications. The industry requirement of a 200 mm wafer with a thickness less than 50 um cannot be met with any current polishing process. The defects and microcracks introduced by abrasive systems create a damage layer that is a large fraction of the desired 50 um thickness. Thin wafers produced by polishing are prone to fracture even with delicate handling. In the "Plasma Jet", wafers are thinned in a batch mode by placing them on a platten and using planetary type motion to move the sub-aperture plasma in a pseudo random fashion across the surface. The discharge is about 1" in diameter and the removal rate is 0 to 20 mm/min for a 200 mm wafer with a uniformity of <5%. Total material removal comes to about 30 $cm^3$/hr.

A number of analytical methods were used to assess surface quality. Scanning electron microscopy did not show defects or scratches on either side of the wafer. X-ray photoelectron spectroscopy, used to measure surface contamination, showed no evidence of elements other than silicon. The chemistry of the plasma is quite specific. As a result, metal or carbon contamination (fingerprints) present before etching were not removed. Transmission electron microscopy did not reveal any sub-surface defects in the silicon crystal supporting the supposition that the plasma is nearly 100% chemical in nature. A number of other studies including optical microscopy and adhesion tests did not reveal any additional defects.

In its current configuration, the DC plasma is not well suited for aspheric generation or material deposition. The trace reactants are introduced along with the bulk gas and, as a consequence, are widely distributed across the discharge, substantially increasing the footprint and the minimum feature size. Electrodes that are used to establish the arc are eroded by the reactants and add particulates to the atom stream; not a problem when material removal is the primary concern and surface roughness is not an issue. Electrode erosion also causes fluctuations in plasma conditions and accounts for the reduced uniformity compared to RIE systems. Detrimental electrode reactions also preclude the use of oxygen and many other plasma gases. Finally, the discharge is not as hot as an ICP and, as a result, the production of reactant atoms is reduced.

A radio frequency (RF) plasma has been used to slice silicon and as a sub-aperture tool to polish optics (13-15). The plasma is generated around a wire or blade electrode immersed in a noble gas atmosphere that contains a trace of reactive components. The plasma converts the reactive precursors to radical atoms that react chemically with the workpiece, removing material one atom at a time. Referred to as chemical vapor machining (CVM), the electrode is brought to within 200 microns of the workpiece wherever material is to be eroded. Analysis has shown the resulting surfaces to be damage free and the process is considered to be entirely chemical in nature. A comparison of damage in silicon for polishing, sputtering, chemical vapor machining and chemical etching is reported in the literature (13). Both mechanical polishing and argon sputtering induced significant damage into the silicon surface. The damage for CVM and wet chemical etching were similar and were close to the intrinsic damage typically found in silicon used in the semiconductor industry.

The non-rotationally symmetric nature of the footprint, makes the process difficult to model and control. In the case of a blade, the footprint takes the shape of a high aspect ratio rectangle with rounded corners. Process rates are limited by the ability of the plasma to decompose the reactive precursor into radical atoms. While no vacuum is required, the workpiece must be enclosed in a vessel to contain the plasma atmosphere.

The inductively couple plasma (ICP) discharge in its most familiar commercial form was originally developed to grow crystals (16, 17). In a configuration remarkably similar to the excitation source used in current analytical spectrometers, a powder of the crystal to be synthesized was aspirated into the center of the discharge. Reed (16, 17) was able to grow boules from 5 to 15 mm in diameter and as long as 30 to 90 mm with a growth rate of 20 to 50 mm/hour. No mention was made of crystal quality. This approach to crystal growth seemed dormant until the early part of this decade when it was used to produce crystalline films of a number of oxides (MgO, ZrO2, NiO, SnO2, TiO2, ZnCr2O4, Cr2O3, CoCr2O4, NiCr2O4, and several rare earth oxides) (18, 19). X-ray diffraction was used to confirm the crystalline nature of the films. Superconducting thin films of Bi—Pb—Sr—Ca—Cu—O were also fabricated with plasma spray methods (20). Between the two efforts, an ICP was used on several occasions to produce ultra fine particle by desolvating droplets aspirated into the discharge (21).

The conditions of the ICP make it ideal as a source for reactive atoms needed for shaping of damage free surfaces. In his initial work Reed surmised that the high electrical conductivity of partially ionized gases (for argon this value is 120 ohm/cm-1 at 15,000° K.) contributed to the ease of plasma formation at high pressures. There are no electrodes and a number of gases can be used as the host matrix; although argon is usually the principle component. A typical discharge is characterized by high current (100 to 1000 amps) and a relatively low voltage (10 to 100 volts). The flowing plasma is not in complete thermodynamic equilibrium; however, ion and excited state atom populations are within 10% of equilibrium values. Electron densities are high (above $10^{15}$ $cm^{-3}$ is typical) suggesting equilibrium temperatures above 9000° K. (22, 23). Reed calculated a peak temperature of 10,000° K.

from the ration of emission intensities for a set of argon lines, again assuming equilibrium, making the ICP an efficient source for the generation reactive atoms.

A number of characteristics can be identified as important to the process and are summarized for the various techniques in table 1. Typically, all of the approaches have one or more areas where they excel. In the case of low cost consumer optics where cost is always an issue, traditional methods such as lapping and polishing will be used for many years. For many applications, such as high fluence optics, the categories of sub-surface damage, contamination and figure control would be emphasized. Unfortunately, none of the current techniques is adequate.

The present invention significantly improves the capabilities of precision manufacturing technology. The invention provides method and apparatus that can remove damage introduced by previous process steps, figure highly aspheric optics or precision components and reduce high frequency surface roughness. The invention functions as a shaping and a finishing operation in both the subtractive and the additive mode. Subsurface damage in the form of cracks and plastically deformed material are removed in a dry etch process. Removal rates are very high and large workpieces can be quickly configured without a vacuum or the requirement of any special atmosphere. Unlike traditional optical finishing procedures, the proposed process is operated primarily in a

TABLE 1

Comparison of finishing and shaping methods

| | Material Set | Figure Control | Removal Rates | Sub-surface Damage | Surface Roughness | Contamination | Footprint | Vacuum Required |
|---|---|---|---|---|---|---|---|---|
| Diamond Machining | Moderate | Very Good | Very High | High | Good | Cutting Fluids | 1 to 100 um | No |
| Lapping and Grinding | Large | Very Good | Moderate to High | Very High | Moderate | Moderate | 25 mm to Full Aperture | No |
| Chemical Etch | Large | None | High | None | Good | Low | Full Aperture | No |
| Traditional Polishing | Small | Flat or Spherical Only | Low | High | Excellent | High | 25 mm to Full Aperture | No |
| RIE | Moderate | Flat Only | Moderate to Low | Low | Good | Low | Full Aperture | Yes |
| PACE | Small | Good | Low | Low | Good | Low | 25 mm to Full Aperture | Yes |
| Ion Milling | Large | Good | Low | Moderate to High | Good | Low to Moderate | 100 nm to 50 mm | Yes |
| Plasma Jet | Small | Flat Only | High | None | Moderate | Possible | 10 mm to 25 mm | No |
| Plasma CVM | Moderate to Small | Moderate | Moderate to Low | None | Good | Possible | Long and Narrow | Enclosed Atm |

SUMMARY OF THE INVENTION

It is in the critical applications last mentioned above that reactive atom plasma polishing (RAPP) is very effective (see Table 2). No other method can produce damage free, non-contaminated surfaces with high removal rates and good figure control over a large range of industrially important materials.

Accordingly, one object of the invention is the removal of material with no continuing roughening of or damage to the material.

Another object of the invention is a wide range of material removal, from one or two layers of atoms at a time to thousands of times the normal etch rate of known techniques.

subtractive manner and does not leave behind a contaminated redeposition layer as a final surface. Figure accuracy, especially for non-spherical surfaces, is improved and process time is reduced, minimizing cost. For many substrates, new and extremely pure bulk material can be added in deficient areas, a feature that will be extremely useful in the repair of expensive optics. The deposition of homogeneous or heterogeneous material is added by including the chemical precursors to the deposition layer in the central gas flow as a gas, liquid or solid. A chemical reaction need not take place in the deposition mode. The discharge can be used in a lower power setting to merely vaporize the additive. An object of the invention is a method and apparatus that can be tuned to

TABLE 2

RAPP Finishing and Shaping Methods

| | Material Set | Figure Control | Removal Rates | Sub-surface Damage | Surface Roughness | Contamination | Footprint | Vacuum Required |
|---|---|---|---|---|---|---|---|---|
| RAPP | Moderate to Large | Good to Very Good | Very High | None | Excellent | None | 0.2 mm to 150 mm | No | produce a deterministic and highly asymmetric surface in a single operation from a data file in either the subtractive or the additive mode.

Final shaping of optics and precision surfaces is executed by exposing the workpiece to reactive atoms generated by an atmospheric pressure, inert gas, inductively coupled plasma discharge (ICP). The plume of the plasma is stable, the reproducible and functions as a sub-aperture tool. The plume has a stable distribution of reactive gases. Reactants are created from trace gases introduced into the discharge and are chosen to fit the chemistry of the workpiece. Material removal mechanisms are almost entirely chemical and reactive gases are chosen to produce volatile reaction products that leave the surface area without assistance. The plasma footprint is highly reproducible, resulting in predicable removal rates over large areas. By translating the plasma across the workpiece, a highly asymmetric damage-free surface can be created. Minimum feature size is determined by the geometry of the discharge and is, for example, in the 0.2 mm range or smaller. Using an iterative approach, workpiece figure accuracy is refined and improved with in-process metrology. For example only, fine control, process rates can be monitored in-situ with emission spectroscopy.

It is understood that the inert gas plasma is only one example of a plasma plume and that other plasma plumes are within the spirit and scope of the invention and claims.

Others aspects, and objects of the invention are evident from the detailed description, the claims and the figures.

DETAILED DESCRIPTION OF THE INVENTION

Figure 1:
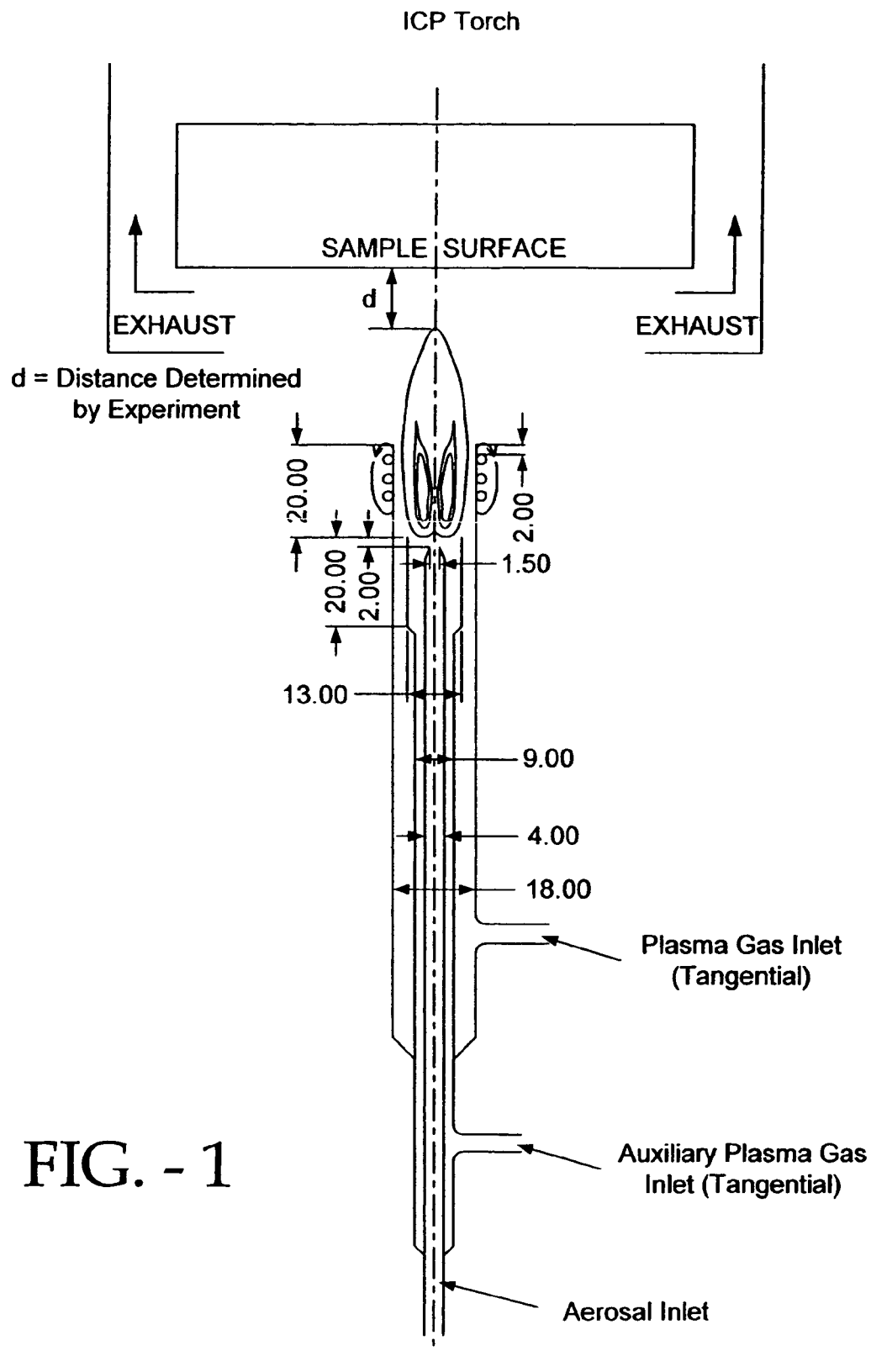
FIG. 1 shows an embodiment of a plasma torch used to configure a workpiece.

FIG. 1 shows a plasma torch with three types of gas flow and the location of the plasma relative to the load coil. This torch is used to configure the workpiece shown. A two tube torch design with an outer (plasma gas) and a central tube will function in an identical manner. The auxiliary tube functions only to adjust the position of the plasma within the load coils to a small degree. The current from a 13.56 MHz or a 27.12 MHZ RF generator flows through a three turn copper load coil around the top of the torch. The energy is coupled into the plasma through a cylindrical skin region that is located on the outer edge of the discharge nearest the load coil. Alternatively, a long outer tube on the torch can be used to cool down the reactive gases while keeping out quenching species from the air (such as nitrogen, oxygen or water vapor). The plasma is supported in a quartz tube by the plasma gas which introduced tangentially to form a stabilizing vortex.

Workpiece material is removed by reaction with reactive species created in the plasma by dissociation of a non-reactive precursor usually introduced in the form of a gas. The precursor can also exists as an aerosol or small particles suspended in the host gas. The precursor is typically introduced into the central tube of the torch facilitating penetration into the center of the discharge. The plasma skin is thin in this region and the precursor easily penetrates the thermal gradient presented by the excited argon atoms. If the precursor is in the form of a gas it can be introduced into the plasma with the plasma gas resulting in a wider etching footprint. The plasma is supported in a quartz tube by the plasma gas which is introduced tangentially to form a stabilizing vortex.

Figure 2:
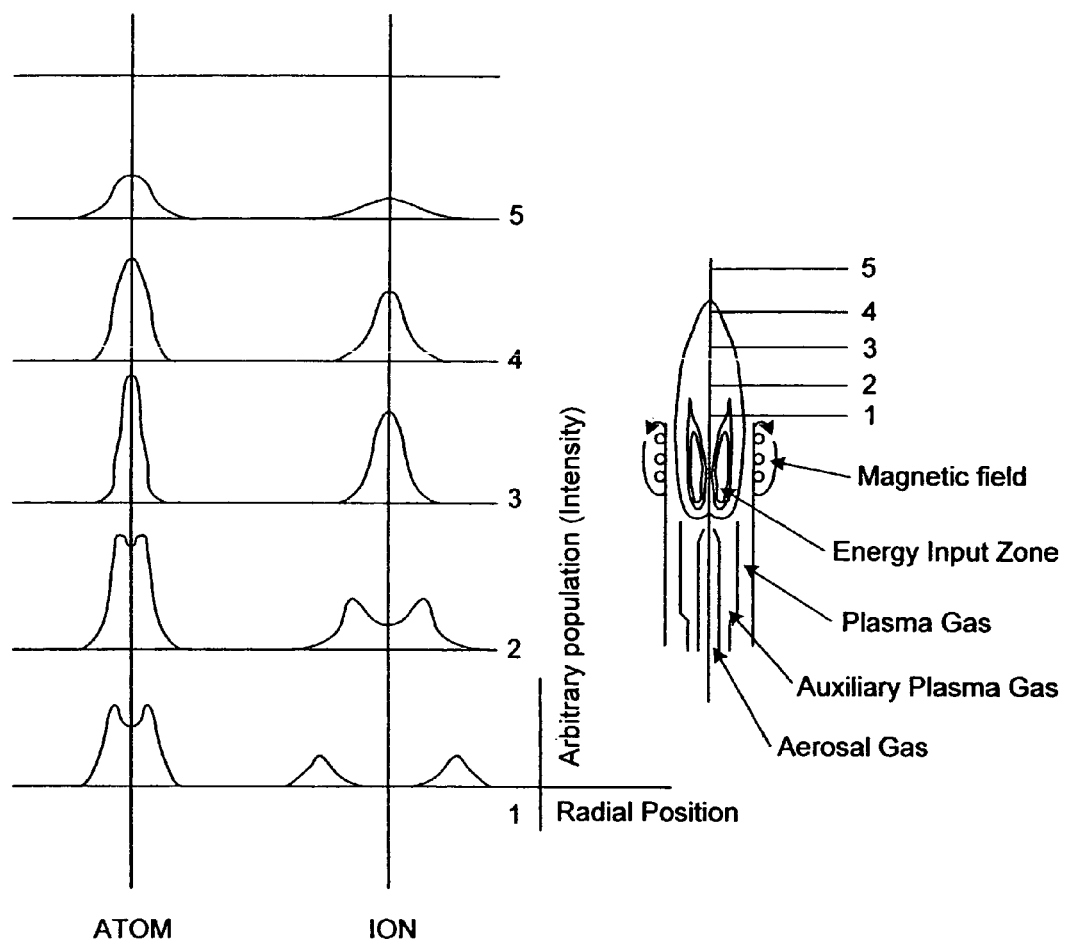
FIG. 2 shows the distribution of ions and atoms in the discharge of the plasma torch of FIG. 1.

As the reactive precursor travels upward it progressively becomes desolvated if necessary, atomized, excited and ionized. The relative distribution of ions and atoms in the discharge is represented in FIG. 2. Spatial profiles for five plasma regions indicate that the ion population decays before that of the excited atoms. The maximum atomic emission occurs several millimeters above the load coil near the visible tip of the discharge (zone 3 and 4). The relative efficiency of material removal depends on the percentage of reactive precursor converted into the proper form for a chemical reaction to occur. Performance of this embodiment of the invention and rate of material removal can be controlled by position of the workpiece relative to the active species in the discharge. Recombination and radiative decay in this region can be used to spectroscopically determine the concentration of the reactive species from the added precursor. Since the main thrust of ICP research has revolved around its use as an excitation source, information on the unexcited neutral atom population throughout the discharge is limited.

The method and apparatus of the atmospheric pressure inert gas plasma device produces reactive neutral species over a limited area and permits controlled chemical erosion of material at a rate of more than 500 um/min. The technique offers several advantages over previous reactive sources for ion-type milling and is a non-contact type shaper/polisher capable of material removal by chemical means. The concentration of reactive species is much higher than reduced pressure systems and removal rates are at least 1000× over RIE and other similar approaches. The system is also capable of removal rates as low as a few layers of atoms at a time. Without the need for a vacuum or environmental chamber, there is no practical limit to workpiece size and the process is easily compatible with a number of in-situ metrology techniques. The complete removal of surface and sub-surface damage, along with the capability to fashion highly aspheric or non-rotationally symmetric components makes it an ideal compliment to other deterministic fabrication techniques (i.e. grinding and single point turning) or to replace them entirely. The injection of reactive precursors into the center of the discharge provides a smaller footprint for greater resolution in the etching of smaller features. The plasma plume produced by the torch has a stable distribution of reactive gases.

The system includes a RF ICP generator and impedance matching network used to produce reactive atoms. Initial sample materials included single crystal silicon (several orientations), fused silica, diamond and silicon carbide. In the system 100 unit, the workpieces 114 (FIG. 4) were held in a vacuum chuck (116) and could be rotated with a rotating stage (108) and translated with a translating stage (110) across the discharge. An additional stage (112) was used to control the distance of the sample to the discharge. With the sample held in one position, the shape and symmetry of the static footprint was measured as a function of plasma power (between 0.75 and 2.5 kW), primary argon gas flow rates (from 5 to 25 L/min), type and concentration of reactive species, discharge size (plasma diameter controlled by the size of outer tube), distance from the plasma and dwell time. With changes in the above parameters, the footprint was found to vary in a predicable fashion.

Figure 5:
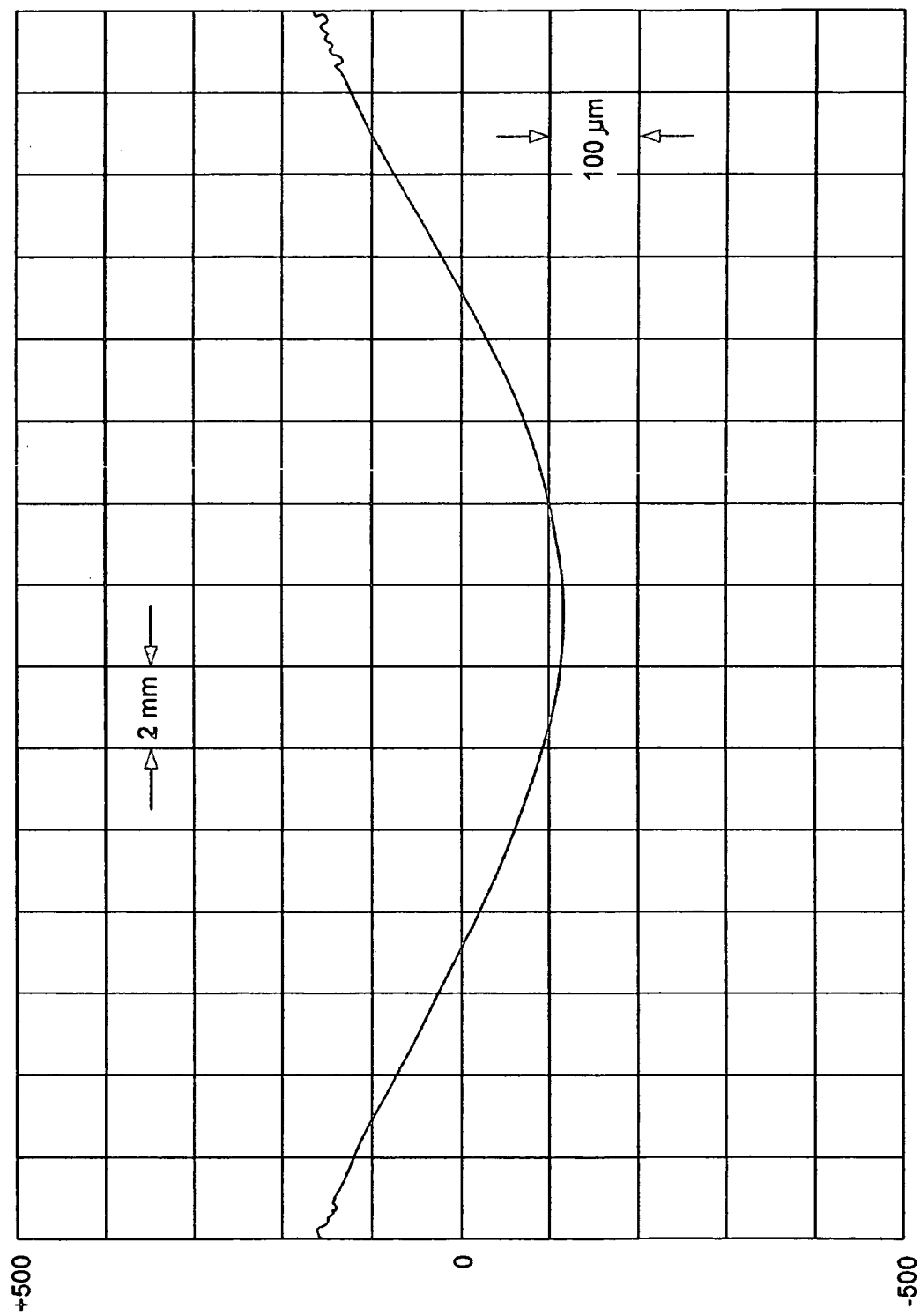
FIG. 5 is a profilometer trace of an etch pit made with an embodiment of a static plasma system of the invention depicting the footprint produced with a particular set of plasma conditions and a specific dwell time.
Figure 6:
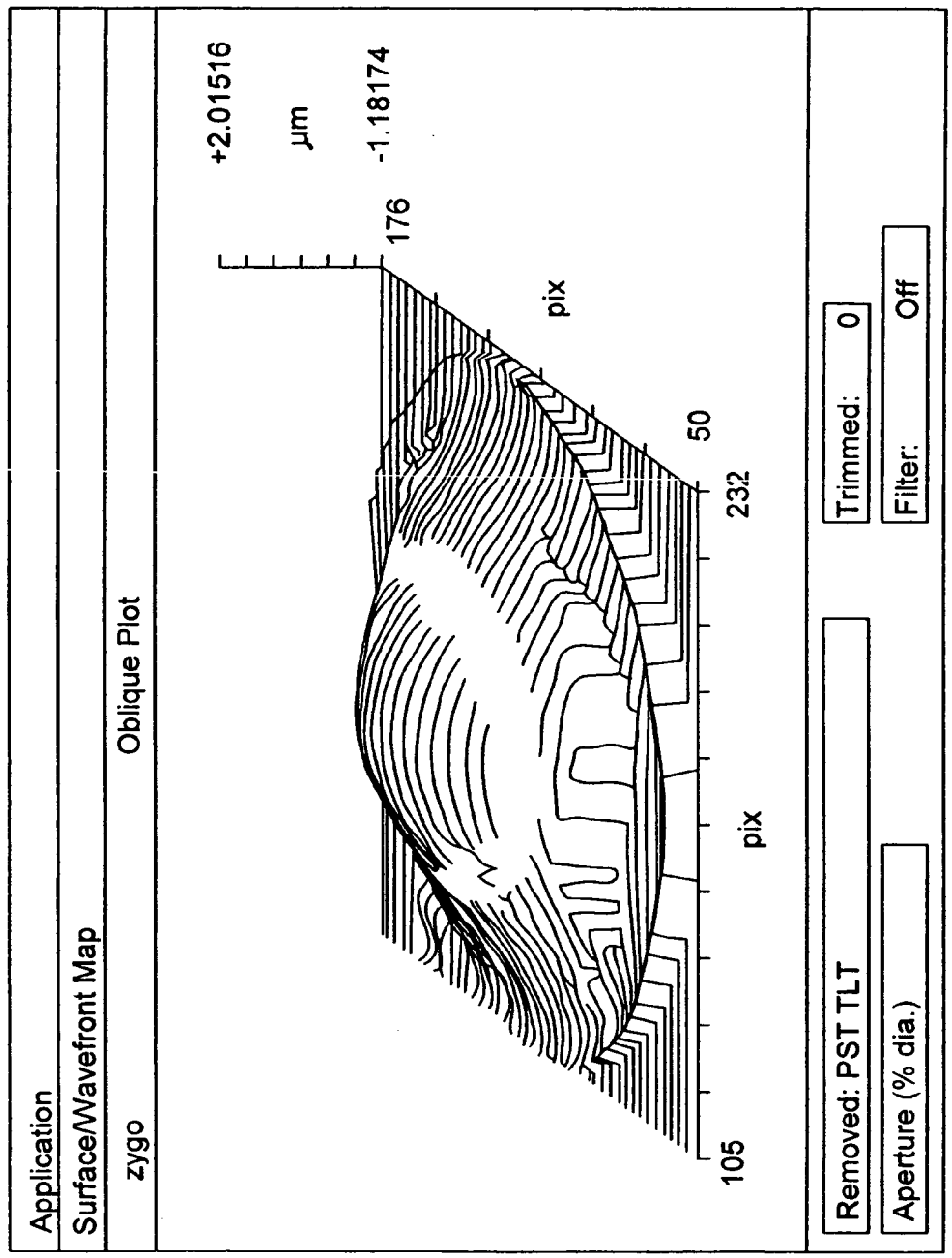
FIG. 6 is a 3-dimensional interferomteric view of an etch pit made with an embodiment of a static plasma system of the invention depicting the footprint produced with a particular set of plasma conditions and a specific dwell time.

The footprint depth and width was measured by tracing the etch pit with a stylus profilometer. Material removal could be calculated from the measured size of the pit and compared to the weight of the material lost by the sample during exposure to the plasma. Material removal rates for two plasma parameters are detailed in FIGS. 7 and 8. A typical footprint with the reactive gas introduced into the center of the plasma is shown in FIG. 5. A Fizeau type interferometer was also used to determine the overall symmetry of the etch pit (FIG. 6). The footprint is Gaussian in nature and has a full width at half maximum equal to 1.0× the inner diameter of the outer torch tube. The width of the footprint is effected only slightly by moderate changes in plasma operating conditions such as power and gas flow rate. As distance from the plasma increases the area of the reactive species and the resulting pattern of material removal tends to broaden. The depth of the footprint is related to distance from the discharge, flow rate of reactive species, power of the plasma and dwell time and varies in a linear fashion over a limited range of operating conditions. One advantage of the invention is demonstrated by sample results is that there was material removal without continuing roughening of or damage to the specimen.

The surface structure of the workpiece was studied with atomic force microscopy (AFM) at several different etch depths. A survey of an etch pit from the edge to the center reveled the presence of subsurface structure indicative of damage that remained from previous processing steps. Depending on the extent of damage from prior steps, it was necessary to remove as much as 100 micrometers of surface material to expose the bulk material below. While related somewhat to the aggressiveness of the process, especially in the case of grinding operations, the damage depth of a polished sample was only loosely correlated to what is considered a good or a bad process. Rather, the main difference between fine and course polishing was the extent of the damage rather than the depth. A well or finely polished sample would have a distinctly lower number of defects per unit area than a coarsely polished specimen. The AFM is also used to monitor the change of surface roughness as a function of experimental parameters. Specifically, power spectral densities (PSD) is measured to determine the effect the etching process has on the type of roughness. As an example, a typically surface for a plasma polished fused silica optic is 0.3 nm Ra as measured with an AFM. Roughnesses as low as 0.1 nm were occasionally obtained.

Analogous removal techniques with other material removal mechanisms (PACE) have indicated that reactive atom plasma treatment shows an increase in surface roughness with etching. This increase is not understood from theoretical or first principle descriptions of the etching process. Current work in optics seems to suggest that the subsurface structure responsible for the roughness is a result of damage introduced in previous process steps. However, a similar increase in roughness is also noted in ion milling where redeposition is known to be a problem. Any increase in surface roughness with reactive atom etching is a function of subsurface structure and not a by-product of redeposition.

An in situ study of reaction products and a post-treatment investigation of surface states indicates the presence and extent of redeposition. The influence of plasma parameters on the concentration of particular products can control reaction mechanisms, permitting optimization of the process for surface finish, removal rates and surface structure.

The plasma is not only a static removal tool, but also a deposition source. Emission or absorption spectroscopy are used to determine the composition of the plasma far downstream. Prior work has suggested that the optimum distance from the discharge is between 380 mm (15) and 600 mm (16). The range of optimum deposition for a particular species is quite narrow and can depend more on physical factors such as temperature than on chemical state or structure. As a result, knowledge of structural, chemical and physical properties of the atoms in the discharge are determined spectroscopically.

A unique application of the system is, for example, to polish single crystal diamond tools for SPDT (single point diamond turning). The vast majority of tools are currently made with abrasive processes. This leads to a damaged layer on the surface of the diamond that degrades the performance of the tool. Typically, tools must be used for an unspecified break-in period before they produce their best surfaces. The break-in period merely amounts to polishing of the tool by the work piece; a poorly controlled process at best. Plasma etching removes the damage layer without propagation of surface fractures or introducing any additional stress into the tool. The results are a stronger, longer lasting tool with superior performance. Presently chemically polished tools are available; but, a peculiarity of the process is a rounded cutting edge. This radius is crucial to the performance of the tool and should be kept as small as possible, ideally under 1 nm. The plasma process does not result in any increase in the radius and, in fact, was used to slightly modify the rake angle leading to sharper cutting edges.

As expected from the static footprint, translating the part relative to the plasma produced a trough with a width very similar to the static condition. The depth, while dependant on all of the same factors as the static system was also effected by velocity in a nonlinear fashion. If the plasma was translated at twice the velocity of a previous experiment, the trough depth was less than 50%. The best explanation for this effect would be heating of the sample by the plasma. The reaction efficiency goes up with temperature so a shorter stay over a particular spot would result in a lower surface temperature and a decreased material removal rate. The present translation system that permits the fabrication of highly aspheric or non-rotationally symmetric components. The system 100 includes two linear stages 110, 112 and one rotary stage 108 that can be controlled independently. Contouring algorithms were adapted from those in the literature, modified to fit the footprint and material removal rates of the reactive atom plasma. These contouring algorithms have produced flat and rotationally symmetric parts.

The plasma polishing aspect of the invention is part of the precision engineering core competency enabling the production of precision components with a high degree of surface quality and integrity for a wide variety of applications. It can be a key shaping and finishing technology for many products, well beyond the application in optics described herein. In addition to homogeneous materials used in optics, the plasma chemistry can be tailored to remove heterogenous materials such as AlTiC, a composite ceramic composed of aluminum oxide and titanium carbide. The ability to shape refractory materials such as silicon carbide at high speed without the use of abrasives is a very important industrial application. The relevance to all programs that rely on precision fabricated equipment is clear. A straightforward application of plasma polishing is the fabrication of large, damage-free, low scatter, aspheric silicon mirrors and lenses. Germanium, while inferior to silicon in terms of strength and cost is currently used because it can be shaped with greater ease. The plasma process permits the substitution of silicon for germanium in infrared optics and windows. A number of applications for these specialized visible and infrared optics currently exists within several branches of the government and in the defense industry.

An example of an important first application for this technology is the fabrication of a large (50" dia.) single crystal silicon mirror for a space based telescope. Prior to polishing, the mirror is single point diamond turned (SPDT) to the correct dimensions. A certain degree of subsurface damage is inherent in the SPDT process. Depending on crystal orientation, the damage layer can be as deep as 10 um. It is extremely difficult to remove this much material with standard polishing process while minimizing figure error. The figuring capabilities of the plasma process will be able to correct the surface of the optic while removing as much material as necessary to eliminate the damage layer. This is a clear situation where a vacuum chamber capable of handling a 50" optic would be an impediment to fabrication if the choice of process was PACE or ion beam machining.

A number of government laser programs, primarily National Ignition Facility (NIF), have a need for damage free lenses. Superior, high damage threshold optics and debris shields would be available for NIF at a decreased cost due to the simplification of the final figuring and polishing step. High material removal rates would increase through-put while producing a parts with no subsurface damage and improved finish and figure. A more pragmatic use would be the in-situ repair of some optics for the new laser. Renewable components such as debris shields can be refinished rapidly in an on-site facility reducing the overall number of pieces in the pipeline. Cracks can be removed and new material deposited in the defect area. For the case of fused silica optics, material would be removed with the addition of $CF_4$ to he plasma following the reaction:

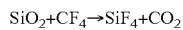

$$SiO_2 + CF_4 \rightarrow SiF_4 + CO_2$$

The addition of glass can be accomplished by adding $SiH_4$ to the plasma gas along with a correct proportion of oxygen.

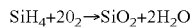

$$SiH_4 + 2O_2 \rightarrow SiO_2 + 2H_2O$$

In order for the system to function in the deposition mode the sample surface must be moved much further away from the plasma than for removal. Distance gives time for the products to condense into small droplets. However, too much distance will cool the particles down past the point where they will coalesce on the surface into a homogeneous film.

Figure 3:
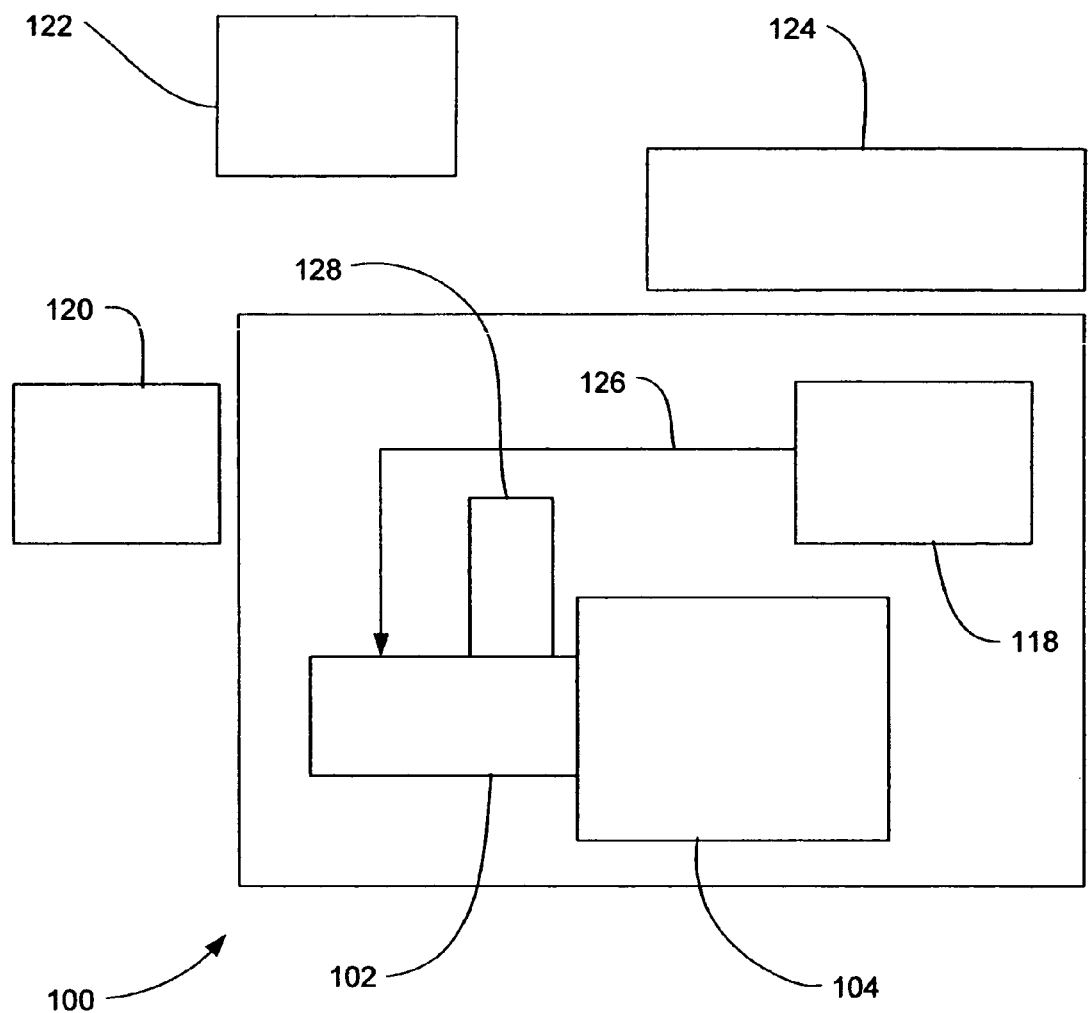
FIG. 3 is a schematic of an embodiment of the invention depicting the overall system.

The overall system 100 of the invention is depicted in FIG. 3. An RF generator and an impedance-matching network are used in the system. The RF generator and the matching network include a primary power unit capable in this example of producing more than 5000 watts of output at 13.56 MHz, an impedance matching network that consists of a coil and two large tuning capacitors, along with a controller to set the capacitor and monitor the power reflected from the induction zone. The configuration of the coils and chamber are described below. The range of gas flow rates necessary to achieve a stable plasma are also described below.

A commercial plasma generator developed for use as a low-pressure etching system for use in the semiconductor industry was modified to produce reactive atoms in a flowing argon stream. The plasma chamber 102, containing the torch and load coils (FIG. 4) was built from copper and attached directly to the impedance-matching network. A four-turn coil is used to couple energy into the discharge, although the exact configuration of the coil cane be altered and the number of turns either increased or decreased to help minimize reflected power and to keep the tuning requirements of the circuit within the range of the impedance matching network. The energy from the RF generator was shunted directly through the water-cooled coil, constructed from 3-mm copper tubing. Unless the plasma is ignited, there is very little resistance to the energy flow. The 5 kW from the generator either (1) reflects back to the source, or (2) flows to ground. After ignition, the power is inductively coupled into the plasma, and very little power is either reflected or lost to ground. Under normal operating condition, the discharge generates large amounts of stray RF energy that must be confined to the plasma chamber. The design must take these two operating conditions into account.

The discharge occurs in the region of the coils. In its present configuration, a crossed X-Y slide and a rotary stage allow the fabrication of rotationally symmetric workpiece up to 200 mm in diameter. Repositioning both the torch and the sample mount within the respective chamber can increase the range of the stages. In the initial system, the stages have a translation distance of 6". A large ventilation duct removes reaction products and the host argon gas along with any unreacted chemicals from the sample chamber.

The first gas used to generate fluorine atoms was a mixture of sulfur hexafluoride ($SF_6$) in a nitrogen matrix. The nitrogen seemed to promote quenching of the reactive atoms, lowering the etch rate to nearly zero and complicating plasma tuning. The precursor was switched to pure $SF_6$ reducing quenching and improving tuning sensitivity. After a prolonged period of use, $SF_6$ appeared to deposit sulfur on the surface of the plasma chamber as well as the sample box (104) and the ventilation system. Energy in the radio frequency range tends to propagate along the surface of a metal. Adding a dielectric to the surface in the form of a sulfur compound substantially altered the system tuning characteristics.

During early operation of the reactive atom plasma, the exterior of the plasma chamber and sample box was measured for RF leakage. The detection system was calibrated by placing it inside the plasma chamber without igniting the plasma. The generator was then operated over a range of power from 0.1 to 1.0 kW to estimate the sensitivity of the detector. Power levels outside the plasma chamber and sample box as well as inside the sample box over the entire range of operating conditions with and without plasma ignition were measured. Not surprisingly, radiation was detected in the workpiece area, although the energy levels were very low when the plasma was ignited. Outside the plasma chamber (102) and sample box (104), it was not possible to detect any RF signal.

To limit reactive atom quenching, the length of the outer torch tube was increased in several steps until it nearly touched the workpiece. For this experiment, a demountable torch was used. The demountable system permits a change in the tube length without dismantling of the entire torch assembly. For a fixed distance between the sample and the induction coils, reaction rates at the surface of the workpiece did increase, suggesting an increase in the reactive atom population. However, surface temperatures also increased. Thermocouples were placed at several locations in the sample box; one above the sample, one between the sample and the rotary stage and two others at probable hot spots in the chamber. The maximum temperature of the workpiece (measured from the rear of a silicon wafer) increased from 70° C. with the short torch (106), to 225° C. with the longest torch (106). With a sample as thin as the silicon wafer, the maximum temperature is reached quickly, a matter of a few minutes, and stays there for the duration of the exposure. At this time, the major concern with the temperature increase is resistance of the stage and motor. To prevent overheating, the sample (114) and chuck (116) were connected to the rotary stage with a stainless steel extension. The chuck (116) and the motor were also covered with a cooling coil.

A silicon wafer with a known mass was exposed to a flow of fluorine atoms from the reactive atom plasma. The fluorine atoms were created from the dissociation of $SF_6$ delivered to the plasma at a flow rate of 30 ml/min. In 20 minutes the silicon wafer was reduced in mass by 0.372 g. In a balanced reaction, two molecules of $SF_6$ react with three atoms of silicon to produce three molecules of $SiF_4$ and two atoms of sulfur:

$$2SF_6 + 3Si = 3SiF_4 + 2S$$

If the reaction were 100% efficient a total of 1.143 g of silicon would have been consumed. Under the operating parameters used in this experiment, silicon reacted with an efficiency rate of 32.6%. The reduction in rate could be from a number of factors. The two most probable are quenching or the inability of the reactants to reach the surface of the workpiece. Quenching of the reactive gases in the plasma can come from at least two sources: either from entrained atmospheric nitrogen or from recombination of the fragmented precursor. At the surface of the workpiece, boundary layer conditions can prevent the fluorine atoms from reacting. Two other experiments were performed under similar conditions, the only change being small changes in flow rate of the reactive gas and a small increase in the plasma power. Similar results were obtained.

EXAMPLES OF PROCESS CHEMISTRY

The chemistry used in the process examples is as follows. The sample materials processed include:

Silicon dioxide (fused quartz) where the balanced reaction of concern is:

$$SiO_2 + CF_4 \rightarrow SiF_4 + CO2$$

Silicon carbide has been tested and can be etched with or without the addition $O_2$. The use of $O_2$ greatly speeds the operation. The balanced equation is:

$$SiC + CF_4 + 2O_2 \rightarrow SiF_4 + 2CO_2$$

For Silicon, $O_2$ has been added:

$$Si + CF_4 + O_2 \rightarrow SiF_4 + CO_2$$

The reaction works with just $CF_4$.

Other fluorocarbons and other molecules containing fluorine also work. $SF_6$ has worked. The equation is the same for $CF_4$ so:

$$3SiO_2 + 2SF_6 \rightarrow 3SiF_4 + 2SO_2 + O_2$$

or $$3SiO_2 + 2SF_6 \rightarrow 3SiF_4 + 2SO_3$$

$C_3F_8$ can be substituted for $CF_4$:

$$2Si + C_3F_8 + 3O_2 \rightarrow 2SiF_4 + 3SO_2$$

and $$2SiO_2 + C_3F_8 + O_2 \rightarrow 2SiF_4 + 3CO_2$$

These reactions will also work without the addition of oxygen.

Reactive species can be introduced to the plasma by aspirating solutions into the central channel (see below). In fact an aqueous solution of HF is useful. The HF supplies the fluorine and the water provides oxygen, if needed.

$$SiO_2 + 4HF \rightarrow SiF_4 + 2H_2O$$

All the above chemistries can be used in an argon gas plasma system.

Preferred System 100

There are several basic blocks to the preferred system 100, each described in more detail in following paragraphs. The plasma box 102 was separated from the sample chamber 104, so the torch 106 could be reused with bigger workpieces or with stages 108, 110, 112 with more travel. Since system 100 is a deposition system as well, the torch is separated from the sample so that a long condensation tube can be installed. The entire system mounts on an optical table. As the removal tool is a ball of hot gas, it is not very vibration sensitive. As depicted in FIG. 3, the system 100 further includes the RF power supply 120, the gas supply 124 which is in the form of gas cylinders, the gas supply line 126, and the tuning capacitors 128. Further, the flow control heads 118 are depicted. These heads are described hereinbelow.

The Plasma Box 102

The plasma box 102 functions to shield the operator from the radio frequency energy generated during the process and from UV light produced by plasma. It is kept under a slight negative pressure through a connection to a chemical hood exhaust system. The entire enclosure is constructed from a single sheet of copper that has been folded rather then connected from individual plates. One of the characteristics of RF is that it travels along a surface rather than through a metal. It tends to find and leak out of seams and around door frames. All edges cannot be avoided, so that the ones that do not move, like the edges of the box, are filled with silver solder and ground with a radius. As a result, there are no sharp point or edges in the system. The components that do move, doors etc., are bolted tight. All of the widows have welders glass and all of the service holes are covered with copper tape.

Figure 4:
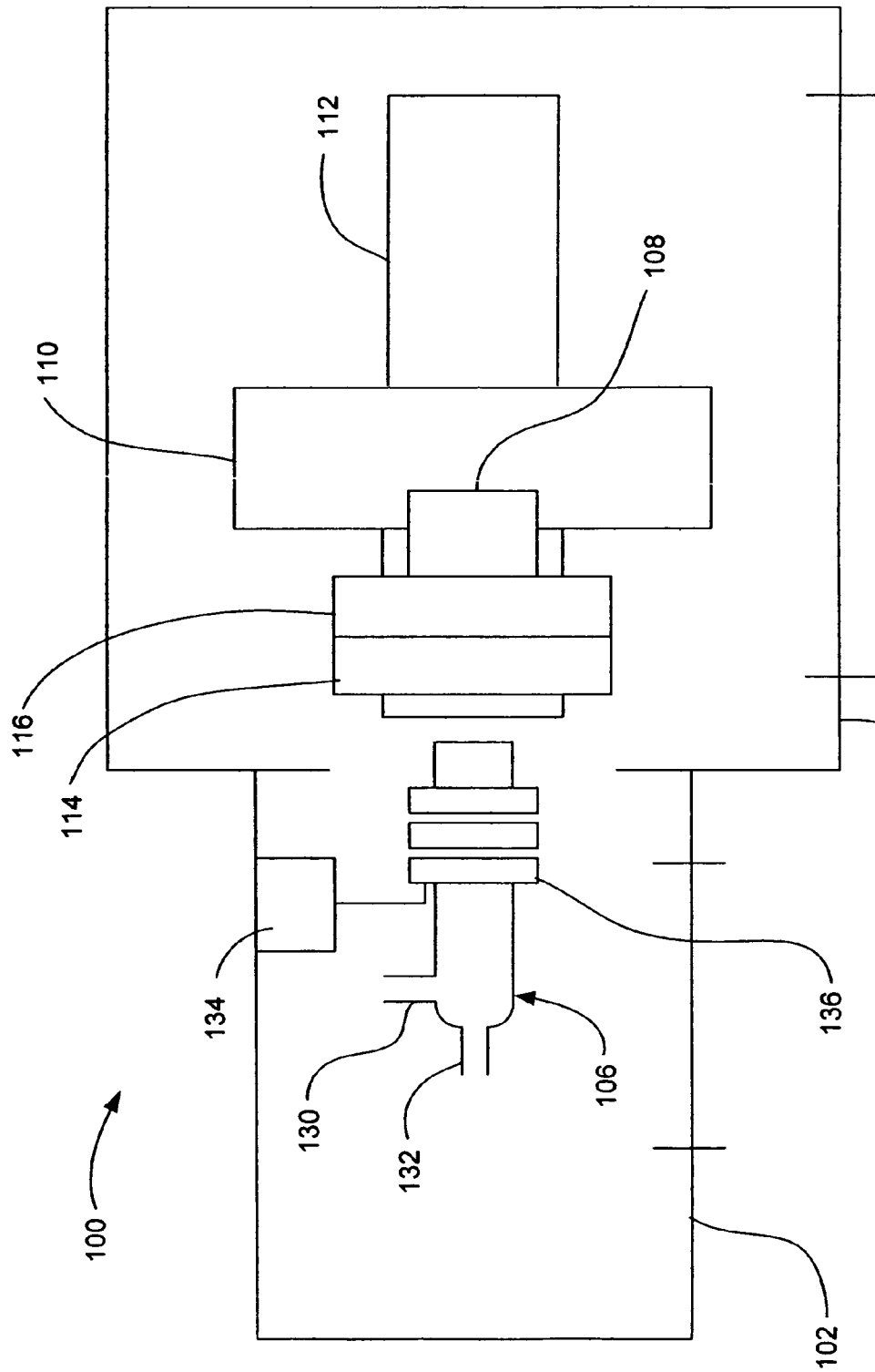
FIG. 4 is a schematic depicting an embodiment of the torch box and sample box of the embodiment of FIG. 3.

In addition, in FIG. 4 with respect to the plasma box 102, which contains the torch 106, central gas inlet port 130 for torch 106 and plasma gas input 132 for torch 106 are depicted. Further, a copper junction block 134 for connection to the tuning capacitors and power supply is also depicted. In addition, the load coils 136, which are connected to the copper block 134, are schematically depicted. These load coils are positioned about the flame. FIG. 4 additionally depicts an extended tube, which can be part of the torch as described hereinbelow.

The Torch 106

A three tube torch is shown. These are purchased from a variety of sources. The torch consists of three concentric tubes. The outer tube handles the bulk of the plasma gas, while the inner tube is used for sample introduction. Energy is coupled into the discharge in an annular region inside the torch by the coils (FIG. 2). As a result of this coupling zone and the ensuing temperature gradient, the simplest way to introduce the reactive gas (or the analyte or a material to be deposited—see Reed 1961 (16, 17)) is in the center. The reactive gas can be mixed with the plasma gas. The central channel is used. This allowed for erasing small damage zones. The second of the three tubes introduces the auxiliary gas typically at about 1 L/min. The auxiliary gas has two functions; to keep the hot plasma away from the inner tube, as even a brief contact can seal it shut, and to adjust the position of the discharge in space. The auxiliary channel could be eliminated if desired.

The inner diameter of the outer tube controls the size of the discharge. On the depicted torch, this is 18 mm or so. In an attempt to shrink the system, torches of a two tube design as small as 6 mm id. were built. Large torches with, for example, a 100 mm opening can produce a 150 mm footprint. If more volume is needed for bulk material removal, multi-head arrangement can be used. Alternatively, a demountable system where the tubes are individually held can be used. In case of damage or a change in operating conditions, each tube can be replaced separately.

The Sample Box 104

The aluminum box 104 contains the workpiece 114, chuck 116, rotational stage 108 and translation stages 110 and 112 (FIG. 4). Construction is from aluminum plates bolted together. It is unnecessary to use copper at this stage because there is no need to shield from RF. The sample box 104 is connected directly to the adjoining torch box 102 through a circular hole. There is a window to watch the part during the process and several holes drilled in the early phase of the project for ventilation intake. The main exhaust system is connected to the top of the chamber. Other designs can have the exhaust hose or the stage in a different location to minimize turbulence around the sample.

The main components inside the chamber with the exception of the sample are the rotational and translation stages 108, 110, 112 and the chuck 116. The chuck is a vacuum chuck. It is mounted to the rotary stage 108 and connected to a carbon vane pump through rotary connection. The chuck 116 preferably is smaller than or equal to the size of the workpiece. If it protrudes past the part, even though it is behind the workpiece, a small amount of chuck material can deposit on the edge or surface.

With respect to the stages, precise positioning available from closed loop systems, glass scales or air bearing stages were not necessary in this embodiment. The removal rate can be quite low and relatively flat over a large area if desired. As a result, positioning in X and Y can be quite course. For large optics the forgivable error in positioning may be as much as 100 microns. Inexpensive stages can easily handle a positioning accuracy of 10 micrometers over a translation range of 150 mm.

The Experimental Enclosure

One use of the system is for the production of UV lenses that have a high damage threshold. Initial 2" optics were noted to damage at approximately twice the fluence of the best previous efforts at optics fabrication. While very encouraging, the tests produced damage curves (a measure of damage vs fluence) that had a few odd bumps on them. One of the explanations for these bumps was surface contamination. It was possible that a contaminant was on the surface of the part, deposited there from the atmosphere during or after processing or was created and left behind as a byproduct of the material removal chemistry. To eliminate the environmental contribution, a clean room enclosure was built around the sample chamber and torch box. The air emerging from the HEPA filters over the experiment is quite clean, on the order of class 1 to 100.

The Control System for the Stages

If any shape on the workpiece is required, other than a Gaussian hole of various depths, it is desirable to translate the part relative to the torch. The translation speed across the workpiece can preferably be controlled in a stepwise fashion (i.e. traverse a certain distance at a fixed speed and at a certain point change the speed).

To produce an approximation to complex (or even flat) surfaces with this system, the part is rotated, while it is translated in front of the discharge. For uniform material removal, the speed of the torch across the surface must be constant.

Mass Flow Controllers 118 (FIG. 4)

Both rotometers and mass flow controllers 118 for metering gas flow can be used. Currently, the system uses mass flow controllers with piezoelectric transducers to monitor gas flow on all lines except the auxiliary. These are commercially available units calibrated for argon.

RF Supply 120 (FIG. 4)

The power source 120 and control panel 122 are rack mounted outside the clean area. This is a commercial power unit 120 primarily created for low pressure capacitively coupled discharges, but easily adapted to this purpose.

OPERATING PROCEDURES

Reactive Gas Conditions

The reactive gas is preferably carbon tetrafluoride ($CF_4$) or fluorine gas ($F_2$). It is a gas at room temperature and is usually introduced into the central channel. Most of the process development has been with $CF_4$ although $F_2$ offers a number of advantages, chiefly the absence of carbon; however, $F_2$ is more difficult to handle as a precursor. Carbon tetrafluoride is used in various concentrations from 100% $CF_4$ to a 1% mixture, always diluted with argon (Ar). The concentrations can also be lower than 1%. For most experiments, the reactive gas introduction is controlled by a mass flow controller over a range of 100 ml of $CF_4$ per minute (in the 10% mixture which was used most of the time) to as low as 0.05 ml per minute with an accuracy in the range of +/−2%. With the current system, it is possible to go from 40 L/min of $CF_4$ to as low as 0.00000001 L/min (10 microliters or 0.01 ml/min); over nine orders of magnitude. The $CF_4$ can also be mixed with helium and also $H_2$. Nitrogen does not work though. There appears to be a quenching effect. As a result, $NF_3$ would not be likely to work as effectively as $CF_4$. In terms of gas handling, the capability exists to concurrently introduce another reactive species like $O_2$, or to pulse the addition of several gasses sequentially with argon buffers between. The pulse introduction mode would be useful when the precursors would tend to react with each other than the workpiece.

Other Gas Flow Rates

The introduction of all gasses is controlled by mass flow controllers 118. There are several controllers in series and parallel with flow ranges from 10 L/min to 0.1 L/min gives much flexibility. For example, if it is desired to introduce 1 ml/min of $CF_4$ into the central channel, with the best flow rate for the central channel being 1 L/min, then to reach the optimal 1 L/min, pure argon is added to the reactive species. In this example, gas would be 900 ml/min of pure argon mixed with 100 ml/min of the 10% $CF_4$ mixture, for a final 1%.

The main gas flow (plasma gas) serves to supply the discharge with a flowing stream of argon. The flow rate can be changed over a fairly wide range, from zero to 40 L/min. If it is really going fast, the plasma can blow out. A large flow rate means a dilution of both the reactive gas and of the energy put into the system. Flows of between 12 L/min and 20 L/min have been used for all of the work with 15.00 L/min and 19.85 L/min being the standard settings. As mentioned before, the auxiliary gas is in the 1 L/min range. Presently to conserve argon, the plasma gas is run at 15 L/min if the power is 1.75 kW or less and up to 20 L/min if the system is operated up to 2.5 kW.

Wide Dynamic Range

One of the features of the systems is the dynamic range of material removal. At its lowest setting, the reactive gas can be delivered in such minute quantities that single atomic layers are removed over a period of seconds or even minutes. The significance of the time is that the system can be turned on and off to remove a single atomic layer of (or on) the surface. On the upper end, $CF_4$ can be a major proportion of the plasma gas, possibly up to 100%. With a larger discharge and a higher gas flow rate, assuming about 30% reaction efficiency, thousands of cubic centimeters of material per hour can be removed. The prototype system is capable of removing 10 cubic centimeters per hour under normal operating conditions.

Power Settings

There are a wide range of power conditions under which the system can operate. A complete unit, including a power supply, a tuning circuit, and a torch box and torch, can be purchased commercially and is used exclusively for emission spectroscopy. In that application, the only purpose is to provide excited-state atoms for observation as an analysis tool. The power supplies themselves are available from a great number of manufacturers and are found in any semiconductor fab typically used for reactive ion etch tools. Similar units have been used in the deposition mode for growing crystals (see Reed 1961).

The RF unit 120 operates at 13.56 MHZ; however, these generators are also available to run at 27.12 MHZ. The RF unit has a maximum power of 5.4 kW in this example only. The system is usually not operated above 2.5 kW and usually runs at 1.5 kW. The system was run as low as 0.75 kW.

The process produces a volatile reaction product. The inner zones of the discharge where the precursor is fragmented into atoms is between 5,000° C. and 15,000° C. As the plasma is a non-equilibrium system, the technique used to measure temperature determines the number obtained. The lower value, 5,000° C., is a gas kinetic temperature and is believed to bear the largest responsibility for heating the part. The material removal reaction occurs downstream from the energetic region of the plasma and is substantially lower in temperature. Removal can occur even if the workpiece is at or near room temperature. The role of the plasma in this process is primarily twofold. The discharge serves to fragment reactive precursors and to distribute the reactive species in a uniform and predictable fashion. Thus, there is a stable distribution of reactive species. A secondary effect is the addition of heat to the system and the effect that has on reaction rates. Any system that can supply energy to fragment the precursor will serve in this application. The energy does not have to come from an induction circuit. A flame from a combustion reaction is also a plasma and will work equally well as an source for reactive species. This fact is also well documented in the analytical chemistry literature where flames were the standard atom sources for decades before the introduction of inert gas plasma sources.

Planarization Effect

One of the unexpected benefits of the plasma process is the tremendous gradient in reaction efficiency with distance from the plasma source. In initial experiment, operated at 1.5 kW with a plasma gas flow of 20 L/min, a distance from the sample to the load coils of 25 mm and a reaction gas flow rate of 50 ml/min, a sample was polished to a 0.3 nm Ra surface roughness and a peak to valley range of a 3.8 nanometers (measured with an atomic force microscope) in 15 minutes. The amount of material removed was 0.106 grams with a reaction efficiency of 0.21. The sample started with a Blanchard ground surface having a peak to valley roughness exceeding 5.6 micrometers. The depression left by the etching was Gaussian in shape, roughly 300 micrometers in depth with a width of 30 mm.

Atmospheric gasses tend to cool the plasma and quench the excited state species a short distance outside the discharge zone. This, in effect, gives a short range over which the removal reactions can occur. The presence of atmospheric pressure air will also cool the sample. The sample itself may be responsible for some of the planarization effect. Energy is much more efficiently conducted away from a flat, homogeneous surface. A rough surface would have spikes that poke into the more energetic regions of the plasma. They would heat up quicker and have fewer pathways to drain away the heat build-up. A fast pass under the plasma can have the effect of planarizing a surface without heating the part.

An application for the invention process is the planarization of vapor or sputter deposited copper surfaces. Copper is the new material for wiring in the latest generator of IC's.

The Footprint

Under conditions described above, a distribution of reactive species can be obtained that is roughly Gaussian in nature and, for a 18 mm i.d. torch, has a spread of about 30 mm (FIG. 5). In one example, a hole was produced by a 1.5 kW plasma with a reactive gas flow rate of 50 mls/minute over a 15 minute period. The distance from the load coils (energy induction zone) to the part surface was 25 mm. As the reaction time was increased or decreased, the hole got deeper or shallower, but not perceptibly wider. A factor in this process is that the footprint is stable and dependent on controllable parameters.

Reaction Efficiencies

Figure 7:
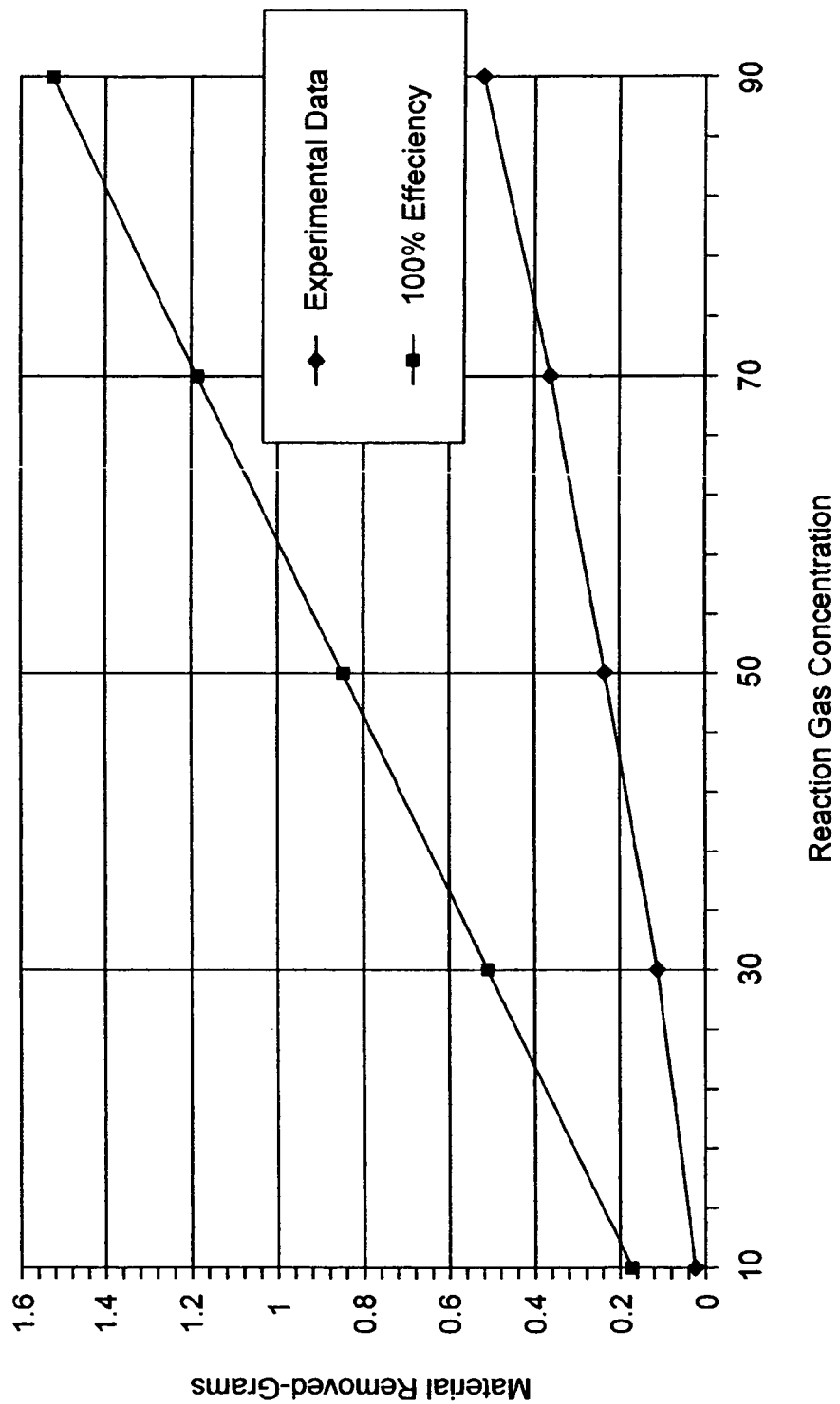
FIG. 7 is a chart of the material removal from a specimen versus the gas flow rate for a specific example.
Figure 8:
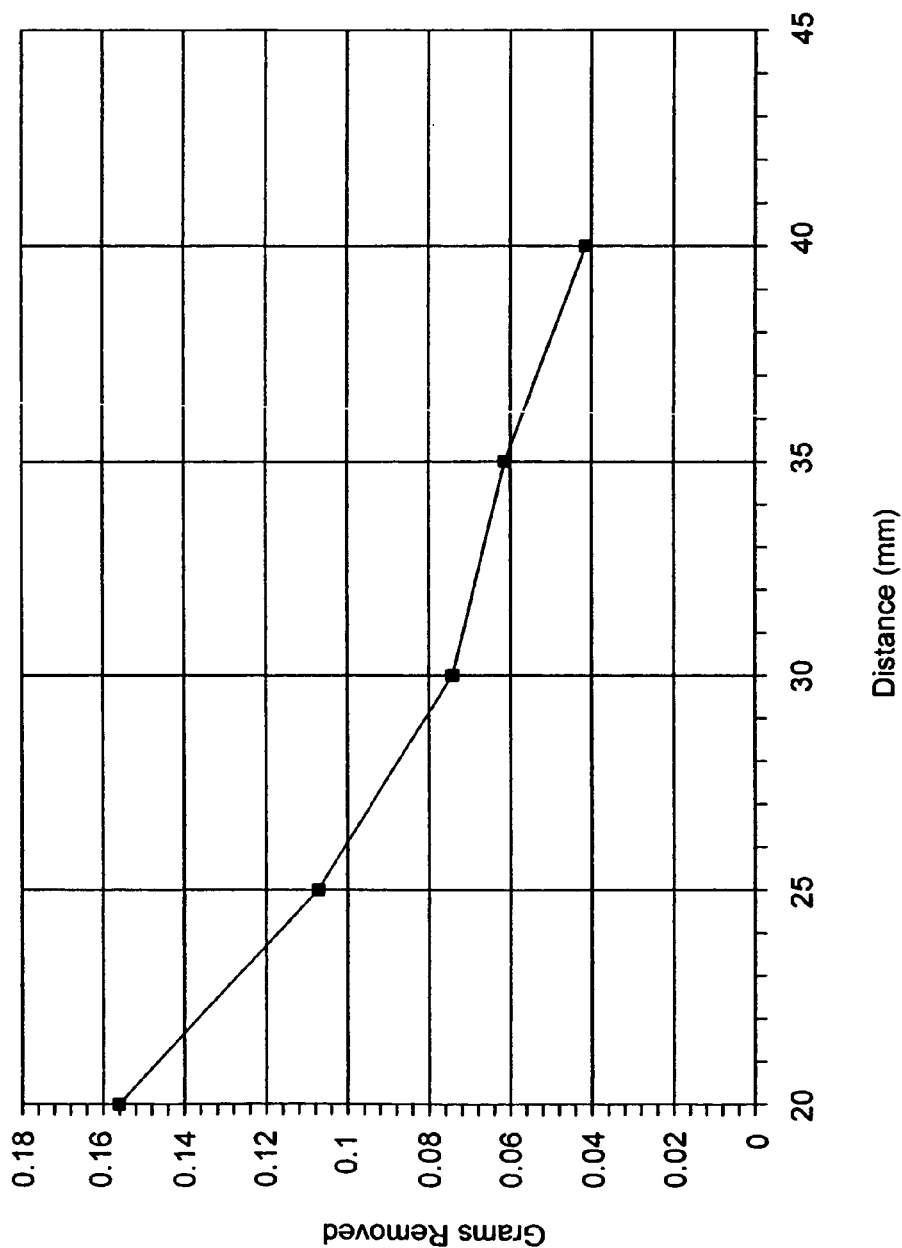
FIG. 8 is a chart showing, for one example, the amount of removal of material from a specimen versus the distance of the plasma from the specimen.
Figure 9:
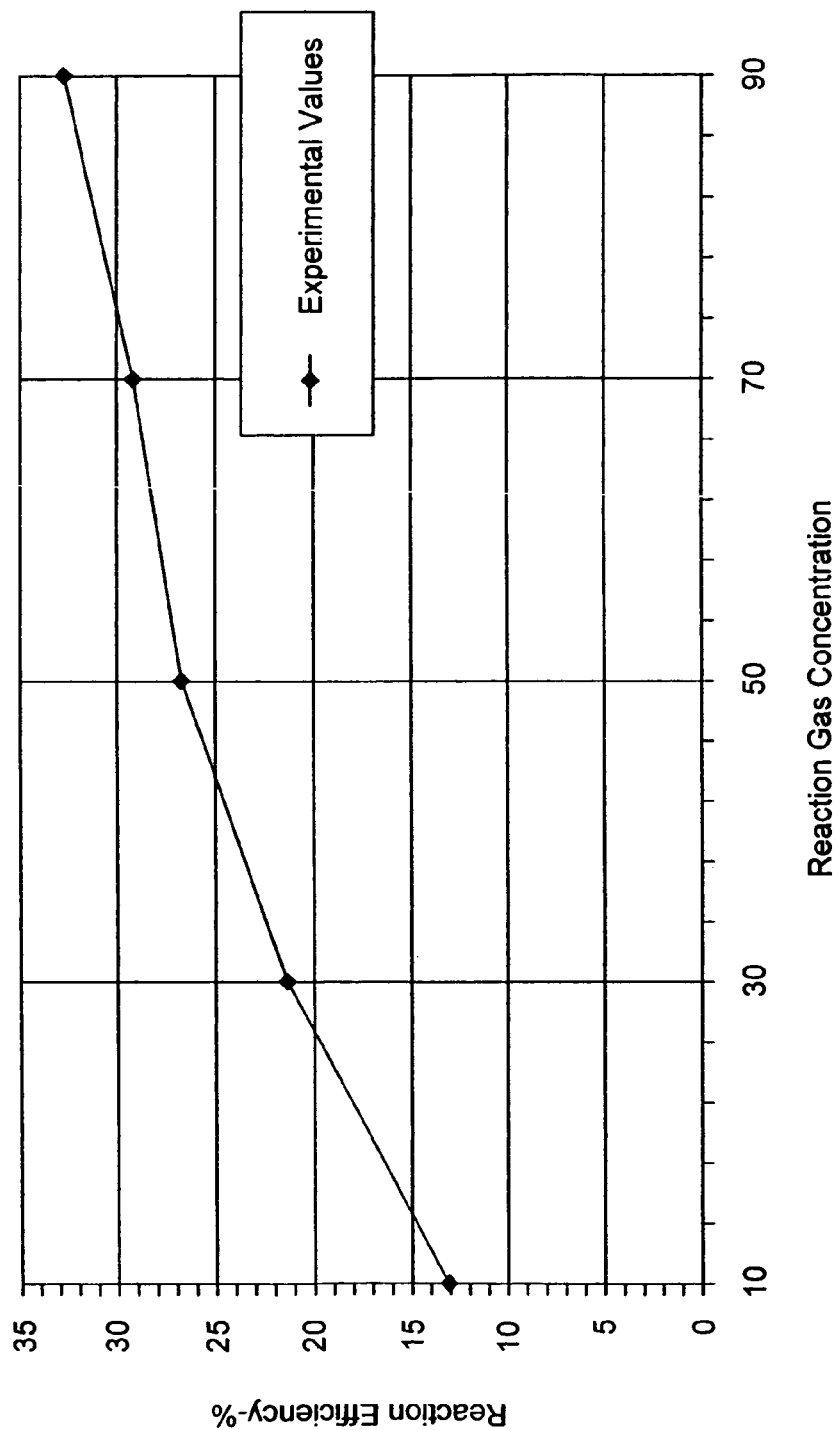
FIG. 9 is a graph depicting the reaction efficiency of a sample reaction versus the gas flow rate.
Figure 10:
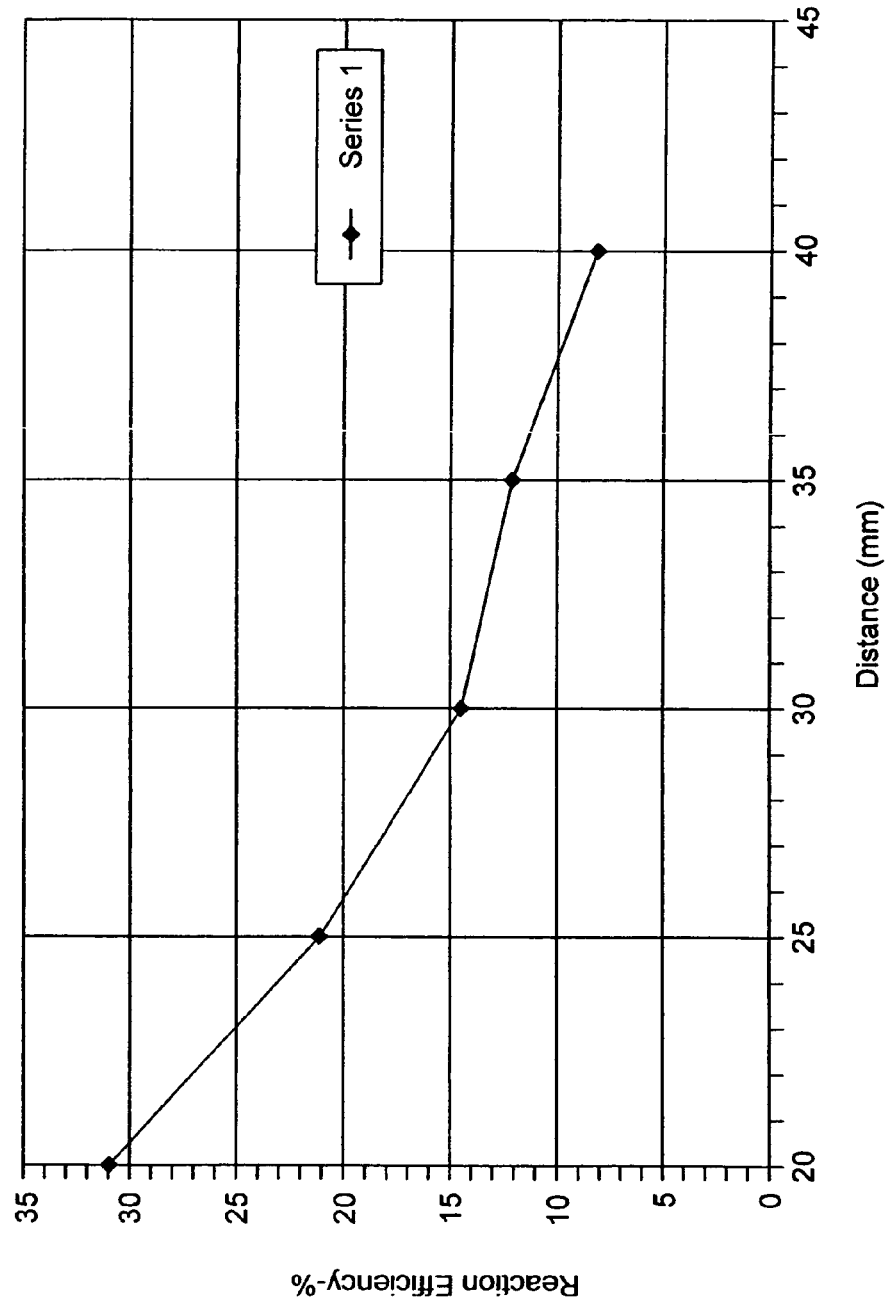
FIG. 10 is a chart depicting the effect of the distance of the plasma from the specimen on the efficiency of the process for a specific example.

Experiments have been performed that measure reaction efficiency and removal rate as a function of several parameters including distance from the sample to the discharge zone, reaction gas flow rate and plasma power. FIGS. 7 and 8 show the number of grams of material removed as a function of reaction gas flow rate and distance to the plasma in a fixed period of time (15 minutes). FIGS. 9 and 10 show the reaction efficiency as a function of reaction gas flow rate and distance to the plasma in a similar time period. FIGS. 7, 8, 9, and 10 were made with respect to quartz.

Other Effects

As a final step in the process, the plasma could be used to put down a coating; however, a more useful attribute may be the ability to subtly alter the chemistry of the surface. A slight addition of oxygen in the plasma at the beginning of the process can clean all organic material from the surface. Reactive surfaces can be capped (as a prevention for corrosion) or a controlled and limited production of surface oxide can be put down as a passivation layer.

INDUSTRIAL APPLICABILITY

Industry benefits from the development of a plasma shaping process in a number of ways. As already mentioned, the production of complicated optics would be simplified and, in some cases, permit the construction of workpieces that could not be made by any other means. Additionally, there is interest in finishing silicon for applications ranging from infrared optics to micromechanical (MEMS) devices (24). As noted earlier, the process permits the substitution of silicon for germanium in infrared optics and windows. Germanium, while inferior to silicon in terms of strength and cost is currently used because it can be shaped with greater ease. Infrared windows could be made into unusual shapes such as the nose or the leading edge on an aircraft wing. These components could be directly fabricated from the best material regardless of machining properties.

Currently, camera lenses are fabricated entirely from spherical optics. The difficulty in fabricating aspheres is so great that a manufacture would complicate a design by using 15 spherical elements when a superior product could be made from a much smaller number of aspheres. Recently, some manufacturers have fabricated optics from machinable or moldable plastics (PMMA). Even with the limitation of refractive indices available from a small range of plastics, these companies decided that the design flexibility from the use of aspheres outweighed the limitations. With inexpensive, high quality, aspheric lenses available, the impact on the industry and the market can be noteworthy.

Numerous other applications are apparent. Some noteworthy examples include the polishing of fiber optics in the field to increase damage threshold, the fabrication of flat and smooth plattens from ceramic materials for hard disk drives, a planarization tool for the semiconductor industry to be used as a replacement for chemical-mechanical polishing or for use in the sharpening of carbide machine tools for extended tool life.

Other features, aspects and objects of the invention can be obtained from a review of the figures and the claims.

It is to be understood that other embodiments of the invention can be developed and fall within the spirit and scope of the invention and claims.

END NOTE REFERENCES

1) G. S. Oehrlein, "Reactive Ion Etching" in Handbook of Plasma Processing Technology, 196 (1994)
2) L. D. Bollinger and C. B. Zarowin, Part 1, Proc. SPIE, 966, 82 (1988)
3) L. D. Bollinger and C. B. Zarowin, Part 2, Proc. SPIE, 966, 91 (1988)
4) S. J. Hoskins and B. Scott, Proc. SPIE, 2542, 220 (1995)
5) S. J. Hoskins and B. Scott, Proc. SPIE, 2542, 235 (1995)
6) A. Meinel, S. Bashkin and D. Loomis, Appl. Opt. 4, 1674 (1965)
7) S. R. Wilson, D. W. Reicher and J. R. McNeil, SPIE, 966, 74 (1988)
8) L. N. Allen and R. E. Keim, SPIE, 1168, 33 (1989)
9) S. C. Fawcett, T. W. Drueding and T. G. Bifano, Opt. Eng., 33, 967 (1994)
10) S. R. Wilson and J. R. McNeil, SPIE, 818, 320 (1987)
11) T. W. Drueding, T. G. Bifano and S. C. Fawcett, Prec. Eng., 17, 10 (1995)
12) O. Siniaguine, Int. Symp. Plasma Process-Induced Damage, 151 (1996)
13) Y. Mori, K. Yamamura, K. Yamauchi, K. Yoshii, T. Kataoka, K. Endo, K. Inagaki and H. Kakiuchi, Nanotechnology 4, 225 (1993)
14) Y. Mori, K. Yamamura, K. Yamauchi and Y. Sano, The Japan-China Bilateral Symposium on Advanced Manufacturing Engineering, Oct. 4, 1996, Hayama, Kanagawa, Japan
15) Y. Mori, K. Yamamura, K. Yamauchi, K. Yoshii, T. Kataoka, K. Endo, K. Inagaki and H. Kakiuchi, Technology Reports of the Osaka University, 43, No. 2156, 261-266, October (1993)
16) T. B. Reed, J. Appl. Phys., 32, 821 (1961)
17) T. B. Reed, J. Appl. Phys., 32, 2534 (1961)
18) M. Suzuki, M. Kagawa, Y. Syono and T. Hirai, J. Crystal Growth, 99, 611 (1990)
19) M. Suzuki, M. Kagawa, Y. Syono and T. Hirai, J. Crystal Growth, 112, 621 (1990)
20) M. Suzuki, M. Kagawa, Y. Syono, T. Hirai and K. Watanabe, J. Mat. Sci., 26, 5929 (1991)
21) M. Kagawa, M. Kikuchi, R. Ohno and T. Nagae, J. Am. Ceram. Soc., 64, C7 (1981)
22) "Inductively Coupled Plasma Emission Spectroscopy, Part I: Methodology, Instrumentation and Performance," in Chemical Analysis, 90, P. W. J. Boumans ed., John Wiley & Sons, New York (1987)
23) "Inductively Coupled Plasma Emission Spectroscopy, Part II: Applications and Fundamentals," in Chemical Analysis, 90, P. W. J. Boumans ed., John Wiley & Sons, New York (1987)
24) ASPE Spring Topical Meeting on Precision Engineering, April 1998, Carmel, Calif.

I claim:

1. A method for shaping optical elements, comprising:
positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
injecting a plasma gas into the outer gas inlet tube;
applying a current to the load coil to inductively couple a radio frequency (RF) power to the plasma gas;
creating an annular plasma;
injecting an auxiliary gas into the auxiliary gas inlet tube to at least partially shield the inner gas inlet tube from the annular plasma;
injecting a reactive precursor into the inner gas inlet tube;
exciting the precursor with the radio frequency (RF) power via the annular plasma to create the at least one reactive species; and
using the at least one reactive species for the damage-free shaping of the surface.

2. A method for shaping elements out of silicon, comprising:
- positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
- injecting a plasma gas into the outer gas inlet tube;
- applying a current to the load coil to inductively couple a radio frequency (RF) power to the plasma gas;
- creating an annular plasma;
- injecting an auxiliary gas into the auxiliary gas inlet tube to at least partially shield the inner gas inlet tube from the annular plasma;
- injecting a reactive precursor into the inner gas inlet tube;
- exciting the precursor with the radio frequency (RF) power via the annular plasma to create the at least one reactive species; and
- using the at least one reactive species for the damage-free shaping of the surface.

3. A method for shaping silica glass optics, comprising:
- positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
- injecting a plasma gas into the outer gas inlet tube;
- applying a current to the load coil to inductively couple a radio frequency (RF) power to the plasma gas;
- creating an annular plasma;
- injecting an auxiliary gas into the auxiliary gas inlet tube to at least partially shield the inner gas inlet tube from the annular plasma;
- injecting a reactive precursor into the inner gas inlet tube;
- exciting the precursor with the radio frequency (RF) power via the annular plasma to create the at least one reactive species; and
- using the at least one reactive species for the damage-free shaping of the surface.

4. A method for shaping aspheric optics, comprising:
- positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
- injecting a plasma gas into the outer gas inlet tube;
- applying a current to the load coil to inductively couple a radio frequency (RF) power to the plasma gas;
- creating an annular plasma; injecting an auxiliary gas into the auxiliary gas inlet tube to at least partially shield the inner gas inlet tube from the annular plasma;
- injecting a reactive precursor into the inner gas inlet tube;
- exciting the precursor with the radio frequency (RF) power via the annular plasma to create the at least one reactive species; and
- using the at least one reactive species for the damage-free shaping of the surface.

5. A method for shaping surfaces, comprising:
- positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
- injecting a plasma gas into the outer gas inlet tube;
- applying a current to the load coil to inductively couple a radio frequency (RF) power to the plasma gas;
- creating an annular plasma;
- injecting an auxiliary gas into the auxiliary gas inlet tube to at least partially shield the inner gas inlet tube from the annular plasma;
- injecting a reactive precursor into the inner gas inlet tube;
- exciting the precursor with the radio frequency (RF) power via the annular plasma to create the at least one reactive species; and
- using the at least one reactive species for the damage-free shaping of the surface; and
- operating so as not to leave behind a contaminated redeposition layer.

6. A method for shaping surfaces, comprising:
- positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
- injecting a plasma gas into the outer gas inlet tube;
- applying a current to the load coil to inductively couple a radio frequency (RF) power to the plasma gas;
- creating an annular plasma;
- injecting an auxiliary gas into the auxiliary gas inlet tube to at least partially shield the inner gas inlet tube from the annular plasma;
- injecting a reactive precursor into the inner gas inlet tube;
- exciting the precursor with the radio frequency (RF) power via the annular plasma to create the at least one reactive species; and
- using the at least one reactive species for the damage-free shaping of the surface; and
- monitoring an emission spectrum to determine process rates.

7. A method for shaping surfaces, comprising:
- positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
- injecting a plasma gas into the outer gas inlet tube;
- applying a current to the load coil to inductively couple a radio frequency (RF) power to the plasma gas;
- creating an annular plasma;

injecting an auxiliary gas into the auxiliary gas inlet tube to at least partially shield the inner gas inlet tube from the annular plasma;
injecting a reactive precursor into the inner gas inlet tube to create at least one reactive species;
using reactive atom plasma processing for the damage-free shaping of a surface; and
using carbon tetrafluoride (CF4) in argon to create the plasma.

8. A method for shaping surfaces, comprising:
positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
injecting a plasma gas into the outer gas inlet tube;
applying a current to the load coil to inductively couple a radio frequency (RF) power to the plasma gas;
creating an annular plasma;
injecting an auxiliary gas into the auxiliary gas inlet tube to at least partially shield the inner gas inlet tube from the annular plasma;
injecting a reactive precursor into the inner gas inlet tube;
exciting the precursor with the radio frequency (RF) power via the annular plasma to create the at least one reactive species; and
using the at least one reactive species for the damage-free shaping of the surface; and
using C2F6 in argon to create the plasma.

9. A method for shaping surfaces, comprising:
positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
injecting a plasma gas into the outer gas inlet tube;
applying a current to the load coil to inductively couple a radio frequency (RF) power to the plasma gas;
creating an annular plasma;
injecting an auxiliary gas into the auxiliary gas inlet tube to at least partially shield the inner gas inlet tube from the annular plasma;
injecting a reactive precursor into the inner gas inlet tube;
exciting the precursor with the radio frequency (RF) power via the annular plasma to create the at least one reactive species; and
using the at least one reactive species for the damage-free shaping of the surface; and
using sulfur hexafluoride (SF6) in argon to create the plasma.

10. A method for shaping surfaces, comprising:
positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
injecting a plasma gas into the outer gas inlet tube;
applying a current to the load coil to inductively couple a radio frequency (RF) power to the plasma gas;
creating an annular plasma;
injecting an auxiliary gas into the auxiliary gas inlet tube to at least partially shield the inner gas inlet tube from the annular plasma;
injecting a reactive precursor into the inner gas inlet tube;
exciting the precursor with the radio frequency (RF) power via the annular plasma to create the at least one reactive species; and
using the at least one reactive species for the damage-free and deterministic shaping of the surface by at least one of:
selecting a part of the surface to shape;
selecting a material to shape on the surface; and controlling the removal rate of a material on the surface under shaping.

11. A method for shaping surfaces, comprising:
positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
injecting a plasma gas into the outer gas inlet tube;
applying a current to the load coil to inductively couple a radio frequency (RF) power to the plasma gas;
creating an annular plasma;
injecting an auxiliary gas into the auxiliary gas inlet tube to at least partially shield the inner gas inlet tube from the annular plasma;
injecting a reactive precursor into the inner gas inlet tube;
exciting the precursor with the radio frequency (RF) power via the annular plasma to create the at least one reactive species; and
using the at least one reactive species for the damage-free shaping of the surface to fit a pre-determined contour.

12. The method of claim 11 operated at one of above and below atmospheric pressure.

13. The method of claim 11 operable on a conductive surface.

14. The method of claim 11 wherein the step of using reactive atom plasma processing to selectively shape the surface is a deterministic step which can be selectively in one of an additive mode and a subtractive mode.

15. The method of claim 11 operated at about atmospheric pressure and at one of above and below room temperature.

16. A method for shaping surfaces, comprising:
positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;
injecting a plasma gas into the outer gas inlet tube;
applying a current to the load coil to inductively couple a radio frequency (RF) power to the plasma gas;
creating an annular plasma;

injecting an auxiliary gas into the auxiliary gas inlet tube to at least partially shield the inner gas inlet tube from the annular plasma;

injecting a reactive precursor into the inner gas inlet tube;

exciting the precursor with the radio frequency (RF) power via the annular plasma to create the at least one reactive species; and shaping the surface deterministically and damage-free with the at least one reactive species to fit a pre-determined contour.

17. The method of claim 16 including the step of moving at least one of the plasma and the surface relative to the other.

18. The method of claim 16 operated at one of above and below atmospheric pressure.

19. The method of claim 16 operable on a non-conductive surface.

20. The method of claim 16 wherein the step of using reactive atom plasma processing to selectively shape the surface is a deterministic step which can be selectively in one of an additive mode and a subtractive mode.

21. The method of claim 16 operated at about atmospheric pressure and at one of above and below room temperature.

22. A method for shaping surfaces, comprising:

positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;

injecting a plasma gas into the outer gas inlet tube;

applying a current to the load coil to inductively couple a radio frequency (RF) power to the plasma gas;

creating an annular plasma;

injecting an auxiliary gas into the auxiliary gas inlet tube to at least partially shield the inner gas inlet tube from the annular plasma;

injecting a reactive precursor into the inner gas inlet tube;

exciting the precursor with the radio frequency (RF) power via the annular plasma to create the at least one reactive species; and shaping a surface deterministically and damage-free with the at least one reactive species by at least one of:
selecting a part of the surface to shape;
selecting a material to shape on the surface; and
controlling the removal rate of a material on the surface under shaping.

23. The method of claim 22 including the step of moving at least one of the plasma and the surface relative to the other.

24. The method of claim 22 operated at one of above and below atmospheric pressure.

25. The method of claim 22 operable on a semiconductor surface.

26. The method of claim 22 wherein the step of using reactive atom plasma processing to selectively shape the surface is a deterministic step which can be selectively in one of an additive mode and a subtractive mode.

27. The method of claim 22 operated at about atmospheric pressure and at one of above and below room temperature.

28. A method for shaping surfaces, comprising:

positioning a distal end of a plasma torch in proximity to a surface so that at least one reactive species from the plasma torch affects the surface, the plasma torch including an outer gas inlet tube, an auxiliary gas inlet tube concentrically arranged within the outer gas inlet tube, an inner gas inlet tube concentrically arranged within the auxiliary gas inlet tube, and a load coil arranged at a distal end of the outer gas inlet tube so that the outer gas inlet tube is nested within the load coil;

injecting a plasma gas into the outer gas inlet tube;

applying a current to the load coil to inductively couple a radio frequency (RF) power to the plasma gas to create an annular plasma;

creating an annular plasma;

injecting an auxiliary gas into the auxiliary gas inlet tube to at least partially shield the inner gas inlet tube from the annular plasma;

injecting a reactive precursor into the inner gas inlet tube;

exciting the precursor with the radio frequency (RF) power via the annular plasma to create the at least one reactive species; and using the at least one reactive species to shape and polish the surface.

29. The method of claim 28 operating in a subtractive manner.

30. The method of claim 28 using a plume of the plasma.

31. The method of claim 28 using a plume of the plasma operating as a sub-aperture tool.

32. The method of claim 28 wherein a plume of the plasma is translated across a workpiece.

33. The method of claim 28 operating in an additive manner.

34. The method of claim 28 for removing damage introduced by previous process steps.

35. The method of claim 28 for removing surface roughness.

36. The method of claim 28, further comprising:
using the at least one reactive species to react with selected materials which comprise the surface.

* * * * *